(12) United States Patent
Di Vincenzo

(10) Patent No.: US 12,062,389 B2
(45) Date of Patent: Aug. 13, 2024

(54) FERROELECTRIC MEMORY CELL ACCESS

(71) Applicant: Micron Technology, Inc., Boise, ID (US)

(72) Inventor: Umberto Di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 537 days.

(21) Appl. No.: 17/323,968

(22) Filed: May 18, 2021

(65) Prior Publication Data
US 2021/0343322 A1 Nov. 4, 2021

Related U.S. Application Data

(63) Continuation of application No. 16/511,423, filed on Jul. 15, 2019, now Pat. No. 11,017,831.

(51) Int. Cl.
*G11C 11/22* (2006.01)

(52) U.S. Cl.
CPC ........ *G11C 11/2259* (2013.01); *G11C 11/221* (2013.01); *G11C 11/2255* (2013.01); *G11C 11/2257* (2013.01); *G11C 11/2273* (2013.01); *G11C 11/2275* (2013.01); *G11C 11/2293* (2013.01)

(58) Field of Classification Search
CPC .............. G11C 11/2259; G11C 11/221; G11C 11/2255; G11C 11/2257; G11C 11/2273; G11C 11/2275; G11C 11/2293
USPC .................................................. 365/145, 149
See application file for complete search history.

(56) References Cited

U.S. PATENT DOCUMENTS

| | | | |
|---|---|---|---|
| 4,039,861 A | 8/1977 | Heller et al. |
| 5,307,304 A | 4/1994 | Saito et al. |
| 5,615,144 A | 3/1997 | Kimura et al. |
| 5,638,318 A | 6/1997 | Seyyedy |

(Continued)

FOREIGN PATENT DOCUMENTS

| CN | 1189234 A | 7/1998 |
|---|---|---|
| CN | 1534782 A | 10/2004 |

(Continued)

OTHER PUBLICATIONS

Chinese Patent Office, "Chinese Office Action," issued in connection with Chinese Patent Application No. 201811541633.8 dated Nov. 2, 2022 (11 pages).

(Continued)

*Primary Examiner* — Connie C Yoha
(74) *Attorney, Agent, or Firm* — Holland & Hart LLP

(57) ABSTRACT

Methods, systems, and devices for accessing a ferroelectric memory cell are described. In some examples, during a first portion of an access procedure, the voltages of a digit line and word line coupled with the memory cell may be increased while the voltage of a plate coupled with the memory cell is held constant, which may support sensing a logic state stored by the memory cell prior the access procedure, and which may result in a first logic state being written to the memory cell. A voltage of the plate may then be increased, and the digit line may then be coupled with the plate. Because the first logic state was previously written to the memory cell, a target logic state may not need to be subsequently written to the memory cell unless different than the first logic state.

20 Claims, 14 Drawing Sheets

(56) References Cited

U.S. PATENT DOCUMENTS

| | | | |
|---|---|---|---|
| 5,831,895 A | 11/1998 | Manning | |
| 6,028,783 A | 2/2000 | Allen et al. | |
| 6,038,160 A | 3/2000 | Nakane et al. | |
| 6,097,624 A | 8/2000 | Chung et al. | |
| 6,208,550 B1 | 3/2001 | Kim | |
| 6,233,170 B1 | 5/2001 | Yamada | |
| 6,256,220 B1 | 7/2001 | Kamp | |
| 6,363,002 B1 | 3/2002 | Nishimura et al. | |
| 6,396,730 B1 | 5/2002 | Lin et al. | |
| 6,771,531 B2 | 8/2004 | Nishihara | |
| 6,804,138 B2 | 10/2004 | Thompson et al. | |
| 6,809,954 B1 | 10/2004 | Madan et al. | |
| 7,133,304 B2 | 11/2006 | Madan et al. | |
| 7,649,763 B2 | 1/2010 | Takashima | |
| 9,613,676 B1 | 4/2017 | Wang et al. | |
| 9,715,918 B1 | 7/2017 | Kawamura | |
| 9,761,312 B1 | 9/2017 | Kajigaya | |
| 9,767,880 B1* | 9/2017 | Carman | G11C 11/2275 |
| 9,786,345 B1 | 10/2017 | Thiruvengadam et al. | |
| 9,786,348 B1 | 10/2017 | Kawamura et al. | |
| 10,074,414 B2 | 9/2018 | Derner et al. | |
| 10,153,018 B2 | 12/2018 | Derner et al. | |
| 10,504,909 B2 | 12/2019 | Vimercati | |
| 11,315,617 B2* | 4/2022 | Vimercati | G11C 11/221 |
| 11,626,151 B2* | 4/2023 | Bedeschi | G11C 11/2259 365/145 |
| 2001/0040815 A1 | 11/2001 | Tanaka | |
| 2002/0075736 A1 | 6/2002 | Kumura et al. | |
| 2002/0079520 A1 | 6/2002 | Nishihara et al. | |
| 2002/0080664 A1 | 6/2002 | Takashima | |
| 2003/0053327 A1 | 3/2003 | Kang et al. | |
| 2003/0185039 A1 | 10/2003 | Komatsuzaki | |
| 2004/0125682 A1 | 7/2004 | Takashima | |
| 2004/0213033 A1 | 10/2004 | Maruyama | |
| 2004/0240250 A1 | 12/2004 | Karasawa et al. | |
| 2004/0245547 A1 | 12/2004 | Stipe | |
| 2005/0063214 A1 | 3/2005 | Takashima | |
| 2005/0201137 A1 | 9/2005 | Mukaiyama | |
| 2005/0243593 A1 | 11/2005 | Sakuma | |
| 2006/0056225 A1 | 3/2006 | Hashimoto et al. | |
| 2006/0146590 A1 | 7/2006 | Fukushi et al. | |
| 2006/0279977 A1 | 12/2006 | Shiga et al. | |
| 2006/0285378 A1 | 12/2006 | Yamaoka et al. | |
| 2009/0010037 A1 | 1/2009 | Kang et al. | |
| 2009/0103348 A1 | 4/2009 | Du | |
| 2009/0168490 A1 | 7/2009 | Madan | |
| 2009/0231902 A1 | 9/2009 | Takashima | |
| 2010/0025747 A1 | 2/2010 | Fukada | |
| 2010/0097839 A1 | 4/2010 | Kim | |
| 2010/0321975 A1 | 12/2010 | Kimura et al. | |
| 2010/0321988 A1 | 12/2010 | Wells et al. | |
| 2012/0127776 A1 | 5/2012 | Kawashima | |
| 2012/0275250 A1 | 11/2012 | Kim | |
| 2014/0239512 A1 | 8/2014 | Pellizzer et al. | |
| 2014/0241076 A1 | 8/2014 | Kwon et al. | |
| 2014/0254267 A1* | 9/2014 | Sakui | G11C 16/10 365/185.11 |
| 2015/0309743 A1 | 10/2015 | Sohn et al. | |
| 2017/0084335 A1 | 3/2017 | Hahn et al. | |
| 2017/0133099 A1 | 5/2017 | Hsu | |
| 2017/0263304 A1 | 9/2017 | Vimercati | |
| 2017/0270991 A1 | 9/2017 | Kawamura et al. | |
| 2017/0352397 A1 | 12/2017 | Guo et al. | |
| 2017/0352398 A1 | 12/2017 | Kawamura | |
| 2018/0002576 A1 | 1/2018 | Dietrich et al. | |
| 2018/0033486 A1 | 2/2018 | Chen | |
| 2018/0190363 A1 | 7/2018 | Lee | |
| 2018/0226116 A1 | 8/2018 | Derner et al. | |
| 2019/0189177 A1 | 6/2019 | Bedeschi et al. | |
| 2019/0189190 A1* | 6/2019 | Di Vincenzo | G11C 11/4091 |
| 2019/0020645 A1 | 7/2019 | Bedeschi et al. | |
| 2020/0051607 A1 | 2/2020 | Pan et al. | |

FOREIGN PATENT DOCUMENTS

| | | |
|---|---|---|
| CN | 101853696 A | 10/2010 |
| CN | 101960531 A | 1/2011 |
| CN | 109074836 A | 12/2018 |
| CN | 109390007 A | 2/2019 |
| CN | 109961809 A | 7/2019 |
| EP | 1492124 A2 | 12/2004 |
| JP | 2000-187990 A | 7/2000 |
| JP | 2000-285682 A | 10/2000 |
| JP | 2002-026277 A | 1/2002 |
| JP | 2003187571 | 7/2003 |
| JP | 2004-362753 A | 12/2004 |
| JP | 2005-085431 A | 3/2005 |
| JP | 2005-209324 A | 8/2005 |
| JP | 2006-164368 A | 6/2006 |
| JP | 2007-149295 A | 6/2007 |
| JP | 2009-217906 A | 9/2009 |
| JP | 2019-521464 A | 7/2019 |
| JP | 2020-509523 A | 3/2020 |
| KR | 20180117200 A | 10/2018 |
| WO | 2017/205007 A1 | 11/2017 |
| WO | 2018/148064 A1 | 8/2018 |

OTHER PUBLICATIONS

Korean Intellectual Property Office, "Notice of Reasons for Rejection," issued in connection with Korean Patent Application No. 10-2020-0082052, dated Apr. 30, 2021 (4 pages).

IPO, "Office Action," issued in connection with ROC (Taiwan) Patent Application No. 107115661, dated Mar. 4, 2019 (5 pages).

China National Intellectual Property Administration, "First Office Action," issued in connection with Chinese Patent Application No. 202010661904.4, dated Jul. 15, 2021 (5 pages).

Chinese Patent Office, "Office Action and Search Report", issued in connection with Chinese Patent Application No. 201811548278.7 dated Oct. 27, 2022 (19 pages).

European Patent Office, "Extended Search Report," issued in connection with European Patent Application No. 18799187.2, dated Apr. 21, 2021 (10 pages).

European Patent Office, "Partial Search Report," issued in connection with European Patent Application No. 18799187.2, dated Jan. 20, 2021 (12 pages).

Grant of Patent received for Korean Patent Application No. 10-2019-7035115, mailed on Dec. 20, 2021, 3 pages (2 pages of English Translation and 1 page of Original Document).

International Search Report and Written Opinion received for PCT Patent Application No. PCT/US2018/031745, mailed on Sep. 11, 2018, 13 pages.

JPO, "Notice of Rejection Ground," issued in connection with Japanese Patent Application No. 2019- 561154, dated Oct. 13, 2020 (6 pages).

Office Action received for Japanese Patent Application No. 2021-016814, mailed on Feb. 22, 2022, 17 pages (9 pages of English Translation and 8 pages of Original Document).

The Korean Intellectual Property Office, "Notice of Reasons for Rejection," issued in connection with Korean Patent Application No. 10-2019-7035115, dated Oct. 26, 2020 (4 pages).

Toshiyuki Nishihara et al.: "A Quasi-Matrix Ferroelectric Memory for Future Silicon Storage", IEEE Journal of Solid-State Circuits, IEEE, USA, vol. 37, No. 11, Nov. 1, 2002 (Nov. 1, 2002), XP011065880.

Korea Patent Office, "Notice of Allowance," issued in connection with Korea Patent Application No. 10-2020-0082052, dated Nov. 22, 2021 (4 pages).

* cited by examiner

FERROELECTRIC MEMORY CELL ACCESS

CROSS REFERENCE

The present Application for Patent is a continuation of U.S. patent application Ser. No. 16/511,423 by Di Vincenzo, entitled "FERROELECTRIC MEMORY CELL ACCESS," filed Jul. 15, 2019, assigned to the assignee hereof, and is expressly incorporated by reference in its entirety herein.

BACKGROUND

The following relates generally to a system that includes at least one memory device and more specifically to ferroelectric memory cell access.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Improving memory devices, generally, may include increasing memory cell density, increasing read/write speeds, increasing reliability, increasing data retention, reducing power consumption, decreasing stress on a memory cell, or reducing manufacturing costs, among other metrics.

DETAILED DESCRIPTION

Figure 1:
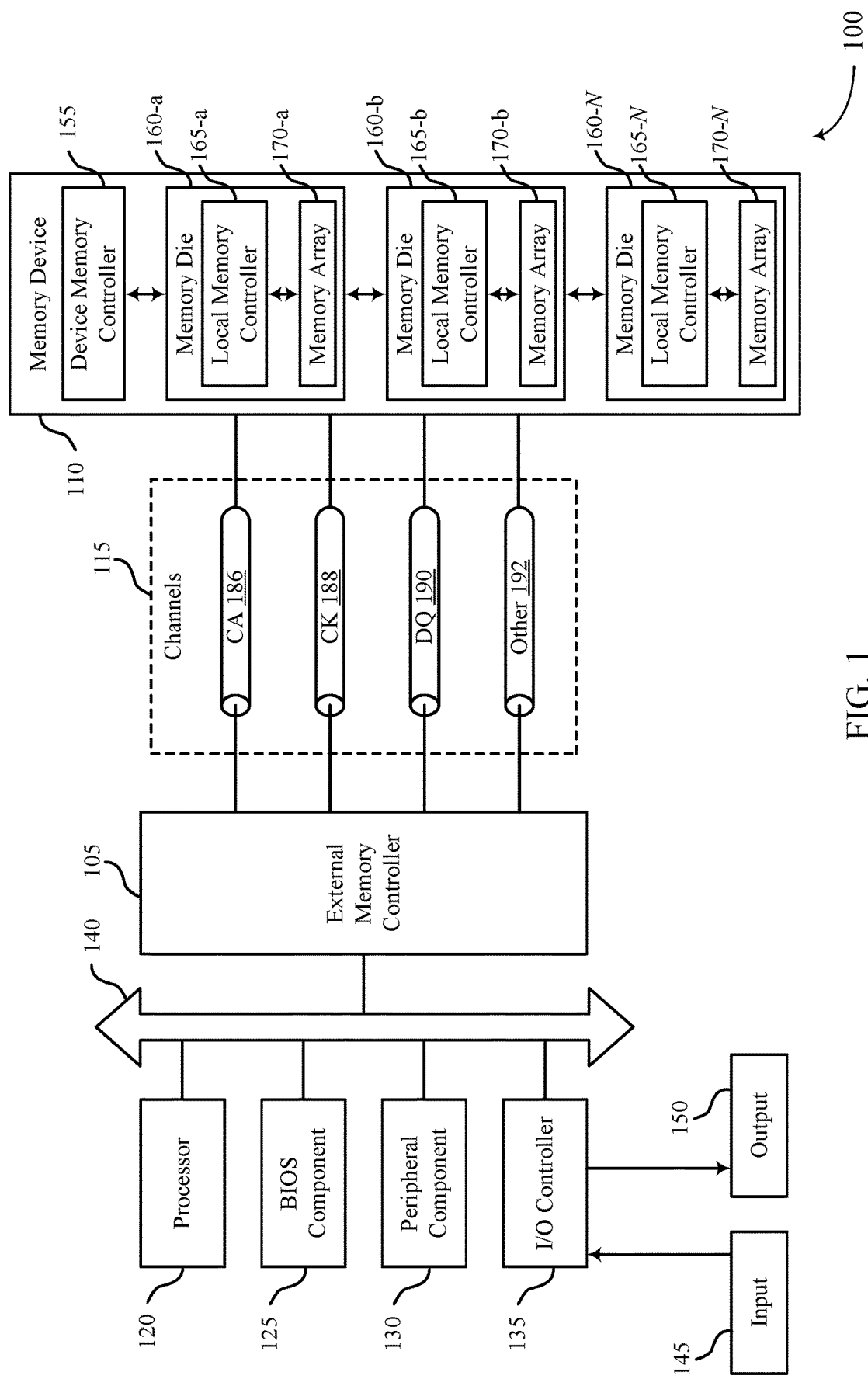
FIG. 1 illustrates an example of a system that supports ferroelectric memory cell access in accordance with examples as disclosed herein.

A memory cell may be accessed (e.g., read, written, refreshed, or any combination thereof) in accordance with aspects of the present disclosure. In some memory architectures, a memory cell (e.g., a ferroelectric memory cell) may be coupled with a digit line, a word line, and a plate. In some cases, a single plate may be common to (e.g., shared by, coupled with) multiple memory cells. Such an architecture may, for example, reduce the complexity of control schemes and related circuitry (e.g., decoder circuitry) compared to each memory cell having a unique, separately controlled plate.

In such a memory array, the memory cells may be arranged into columns and rows where each row of memory cells corresponds to (e.g., is coupled with) a same word line, and each column of memory cells corresponds to (e.g., is coupled with) a same digit line. In some memory architectures, accessing a memory cell (e.g., to read a logic state stored in the memory cell or write a logic state to the memory cell) may include applying a non-zero voltage across the memory cell for at least some duration. The applied non-zero voltage may introduce stress on the memory cell during the time it is applied, and a longer application time per access operation may increase power consumption and reduce the usable lifetime of the memory cell. Additionally, voltages applied to access lines coupled with the accessed memory cell may disturb the logic states stored by neighboring memory cells (e.g., due to leakage), which may negatively impact the performance of the entire memory array. Thus, it may be advantageous to limit the amount of time a non-zero voltage is applied across a memory cell in order to reduce stress and disturbance, and otherwise improve performance and efficiency in operating the memory array.

As discussed herein, a memory device may include a sense amplifier that is coupled with a latch, which may be configured to sense the logic state stored in the memory cell. During a first portion of an access operation, the memory cell may be activated for a first duration by selecting (e.g. increasing the voltages of) a respective digit line and word line. The first portion of the access operation may be based on (e.g., triggered by), for example, an activation command, which may be received by the memory device from a host device. During the first duration, a voltage of the plate may remain low, a logic state previously stored by the memory cell may be sensed, and the sensed logic state may be stored in the latch. As a result of the voltage values of the selected digit line and the plate during the first duration, a first logic state (e.g., a logic "1") may be at least partially written to the memory cell during the first duration (e.g., regardless of what logic state the memory cell stored prior to the first duration, and thus regardless of the sensed logic state). It is to be understood that the logic value ascribed to a logic state (e.g., whether a given logic state is referred to as a "1" or a "0") may be an arbitrary decision.

During a second portion of the access operation, a voltage of the plate may be increased. One or more unselected digit lines (e.g., digit lines that do not correspond to the selected memory cell but instead correspond to unselected memory cells) may be coupled with (e.g., shunted to) the plate, such that the voltages of each unselected digit line may track the voltage of the plate (e.g., throughout the access operation). By coupling the unselected digit lines to the plate, disturb and leakage may be minimized for the unselected memory cells (e.g., by ensuring a substantially zero voltage differential across the unselected memory cells).

Furthermore, after the voltage of the plate is increased, the selected digit line may be coupled to the plate. Coupling the selected digit line to the plate may ensure that the voltage of the selected digit line and the plate are the same (or at least substantially the same), which may allow for the selected memory cell to exist in a zero-voltage state. This may, at least temporarily, reduce any stress otherwise placed on the memory cell due to its digit line being selected. In some cases, coupling the selected digit line to the plate after the plate voltage increases may also prevent, mitigate, or otherwise compensate for (e.g., reverse) overshoot that may otherwise occur (e.g., due to the plate voltage increasing and capacitive cross-coupling between the selected digit line and the plate, between the selected digit line and the unselected digit lines whose voltages may track the plate).

In some cases, after coupling the selected digit line to the plate, the memory device may monitor for one or more commands (e.g., from the host device), such as a read command, a write command, a refresh command, or a precharge command (or other command that may cause the memory device to deactivate the word line or otherwise end the access operation).

A third portion of the access operation may include writing a target logic state to the memory cell. The third portion of the access operation may be based on (e.g., triggered by, initiated in response to) a precharge command, for example, which may be received by the memory device from the host device. In some cases, the access operation may include or be included in a refresh or other write-back operation. In such cases, the target logic state may be the sensed logic state. In other cases, the memory device may receive a command (e.g., a write command) specifying the target logic state, which may be the same as or different than the sensed logic state. In a write operation, the target logic state may be written to the latch rather than directly to the memory cell, which may further reduce an amount of time the memory cell experiences a non-zero voltage differential.

Because a first logic state (e.g., a logic "1") was previously written to the memory cell as a result of the digit line and plate voltages during the first portion of the access operation, no further action may be required during the third portion of the access operation to write the target logic state if it is the same as the first logic state. For example, if a command to write the first logic state to the memory cell is received before the precharge command, or if the sensed logic state in a refresh or write-back scenario was the first logic state, the first logic state may have already been written to the memory cell. Thus, when the target logic state is the first logic state, zero volts may be applied to the memory cell (e.g., a zero voltage differential may exist between the digit line and the plate) after the voltage of the plate is increased, which may reduce stress on the selected memory cell and the risk of disturb or leakage for other (unselected) memory cells.

Alternatively, if the target logic state is a second logic state (e.g., a logic "0"), the digit line may be grounded during the third portion of the access operation and the second logic state may be written to the memory cell from the latch (e.g., based on a signal generated by the latch). For example, the selected digit line may be decoupled from the plate, the digit line voltage may be reduced (e.g., to ground) while the plate voltage is maintained at a higher voltage, and the resulting voltage differential across the memory cell may write the second logic state. The digit line voltage may subsequently be increased, and in some cases, the digit line may be coupled (e.g., recoupled) with the plate.

After the target logic state has been written to the memory cell, the word line may be deselected (e.g., its voltage returned to its value before the access operation), and the voltages of the plate and selected digit line may subsequently be decreased (e.g., returned to ground) to conclude the access operation. In some cases, the voltages of the plate and selected digit line may be decreased by decreasing the plate voltage while the selected digit line is coupled with the plate. In some cases, coupling the selected digit line and other unselected digit lines with the plate while decreasing the plate voltage may support an increased slew rate (rate of voltage decrease) and thus support a reduced overall duration of the access operation while reducing or otherwise mitigating the risk of disturb for the memory cells coupled with the selected and unselected digit lines.

An access procedure that allows for reducing the amount of time a non-zero voltage is across a memory cell during the access procedure (e.g., for a read or write operation), such as the access procedures described herein, may be beneficial. For example, such an access procedure may reduce power consumption—e.g., by reducing leakage to parts of the memory device not involved in the access procedure. As another example, such an access procedure may reduce fatigue or other wear out mechanisms for memory cells. Access procedures as described herein may also allow for faster access (e.g., read or write) operations—e.g., by allowing for increased slew rates during one or more portions of the access procedure, or by in some cases obviating the need for further action to write a target logic state based on prior sensing operations already having written the target logic state. an Access procedures as described herein may also allow for the use of a latch having a low voltage supply (e.g., by using the latch to write only a lower-voltage logic state to the memory cell), which may provide benefits related to areal savings, or ease or cost of fabrication. These and other benefits may be appreciated by one of ordinary skill in the art.

Features of the disclosure are initially described in the context of a memory system and memory die as described with reference to FIGS. 1-3. Features of the disclosure are described in the context of a memory array, timing diagrams, and a circuit diagram as described with reference to FIGS. 4-9. These and other features of the disclosure are further illustrated by and described with reference to an apparatus diagram and flowcharts that relate to ferroelectric memory cell access as described with references to FIGS. 10-14.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands, such as activation and precharge commands as described herein. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165

(e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., PAM3 signal or PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, the memory device 110 may support an access operation as described herein, which may reduce the stressed placed on selected memory cells, and may prevent leakage and disturbance of unselected memory cells. During a first portion of the access operation, a logic state stored by a selected memory cell may be sensed and stored to a latch. During the first portion of the access operation—and in some examples, part of a second portion—a first logic state (e.g., a logic "1") may be written to the memory cell due to the voltages of the selected digit line and plate. Accordingly, if the memory device 110 subsequently receives a command or otherwise determines (e.g., as part of a refresh operation) to write the first logic state to the memory cell, the first logic state has already been stored, which may help reduce the stressed placed on memory cells over time. Additionally or alternatively, if the memory device 110 receives a command or otherwise determines (e.g., as part of a refresh operation) to write a second logic state, the second logic state may be stored to the latch and subsequently written to the memory cell.

Figure 2:
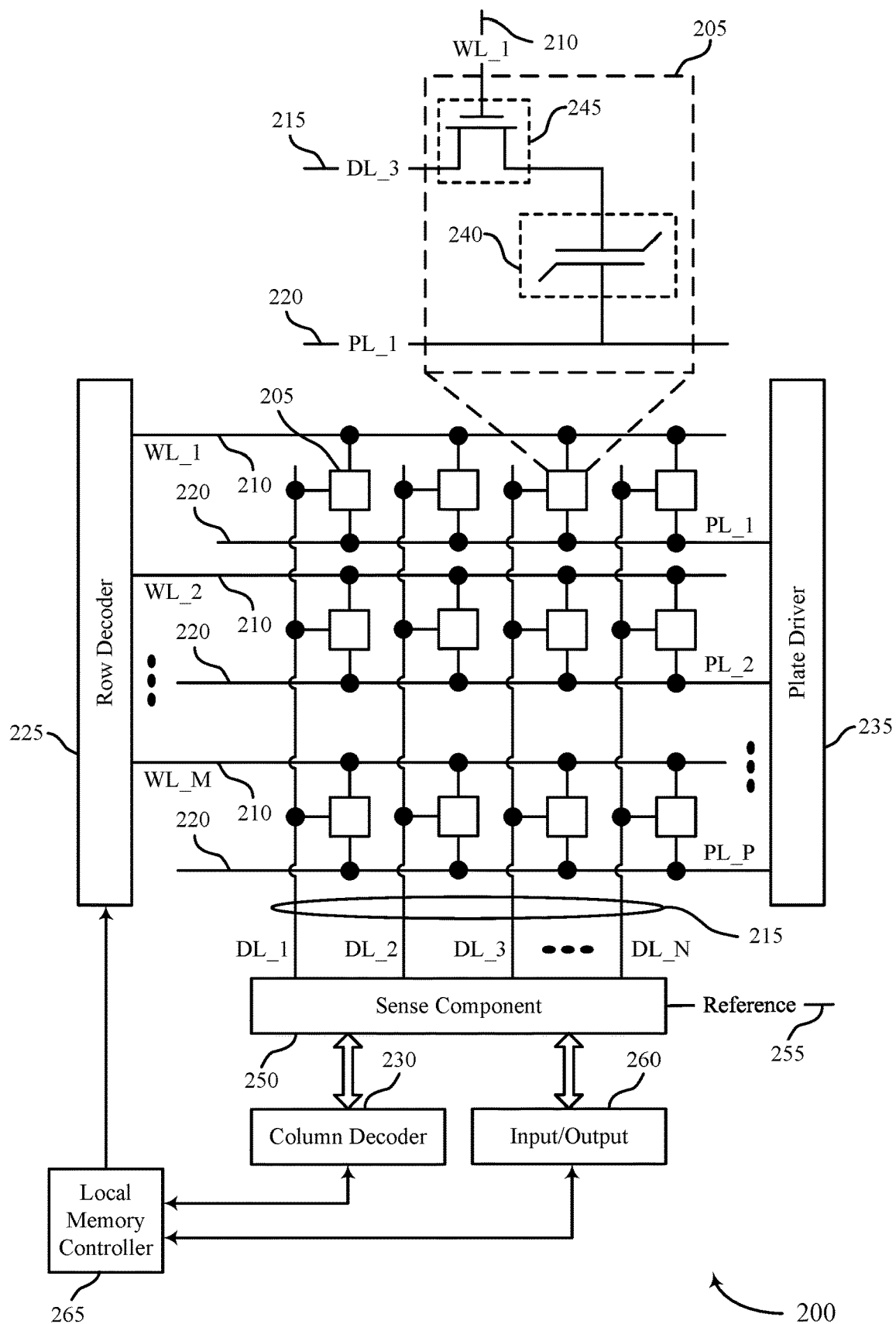
FIG. 2 illustrates an example of a memory die that supports ferroelectric memory cell access in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of information at a time (e.g., a logic 0 and a logic 1). In some cases, a single memory cell 205 (e.g., a multi-level memory cell) may be configured to store more than one bit of information at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. In some cases, a column decoder 230 may include one or more shunts (e.g., transistors), which may each be operable to selectively couple and decouple a respective digit line from a plate. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be selectively placed in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205. In some examples, the plate line may be coupled with a digit line via a transistor (e.g., a shunt).

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge.

During a read operation, the capacitor 240 of memory cell 205 may output a signal to (e.g., discharge to or receive a charge from) its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals.

The detected logic state of the memory cell 205 may be provided as an output of the sense component 250 (e.g., to an input/output 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235. In some examples, the sense component 250 may be coupled with a latch that is configured to store a sensed state of the memory cell 205. As discussed herein, data to be written to the memory cell 205 may be first stored to the latch and, in some examples, written to the memory cell 205 from the latch.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation. In some cases, a precharge operation may additionally or alternatively refer to deactivating a word line or otherwise closing an open page (e.g., row) of memory cells.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

As discussed herein, during a first portion of an access operation—and in some examples, part of a second portion—a first logic state (e.g., a logic "1") may be written to the memory cell due to the voltages of the selected digit line and plate during the first portion. Accordingly, if the memory device 110 subsequently determines (e.g., based on a received write command or refresh command) to write the first logic state to the memory cell, the first logic state has already been stored. Thus, a write operation may not need to be performed. Additionally or alternatively, if the memory device 110 receives a command to write a second logic state (e.g., a logic "0"), the second logic state may be stored to the latch and subsequently written to the memory cell.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some examples, during a read operation of the memory cell 205, the selected digit line 215 may be increased to a relatively high voltage, and the plate (e.g., the plate line 220) may be maintained at a relatively low voltage. Accordingly, during (e.g. as a result of) the read operation, a first logic state (e.g., a logic "1") may be written to the memory cell. Thus, if the memory device receives a subsequent command to write the first logic state to the memory cell, the memory cell is already programed to the desired logic state.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

As discussed herein, during the read operation of the memory cell 205, a logic state of the memory cell may be sensed and stored to a latch, and a first logic state (e.g., a logic "1") may be written to the memory cell due to the voltages of the selected digit line and the plate used during sensing. Accordingly, in the case of a re-write operation, a previously read logic state may not need to be re-written to the memory cell from the latch unless the previously read logic state differs from the first logic state.

Figure 3A:
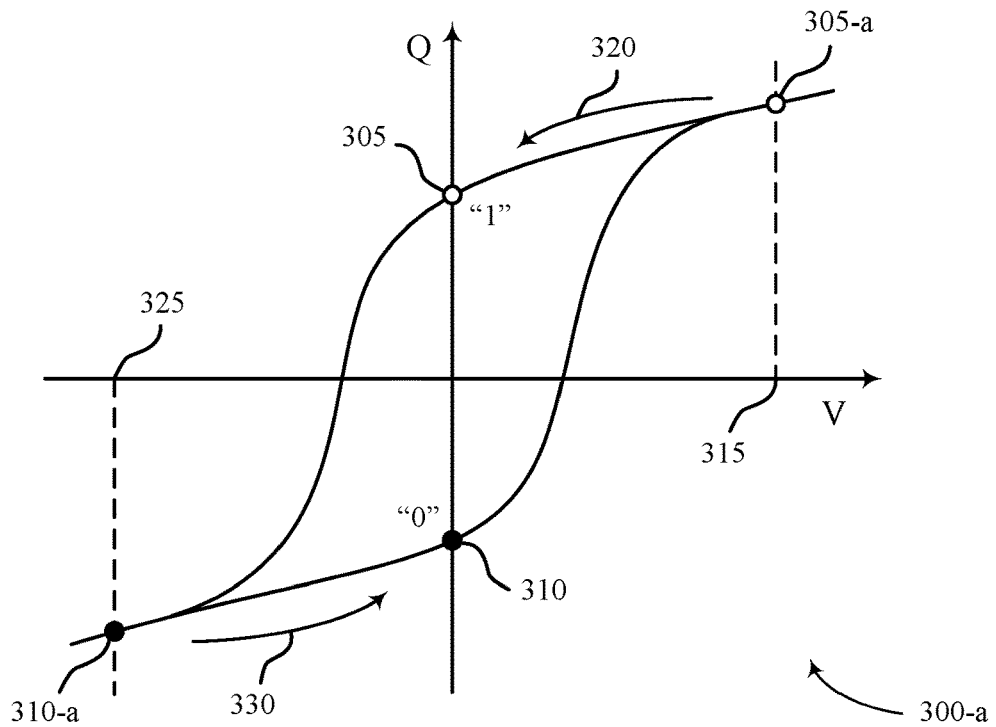
FIGS. 3A and 3B illustrate examples of hysteresis curves that support ferroelectric memory cell access in accordance with examples as disclosed herein.
Figure 3B:
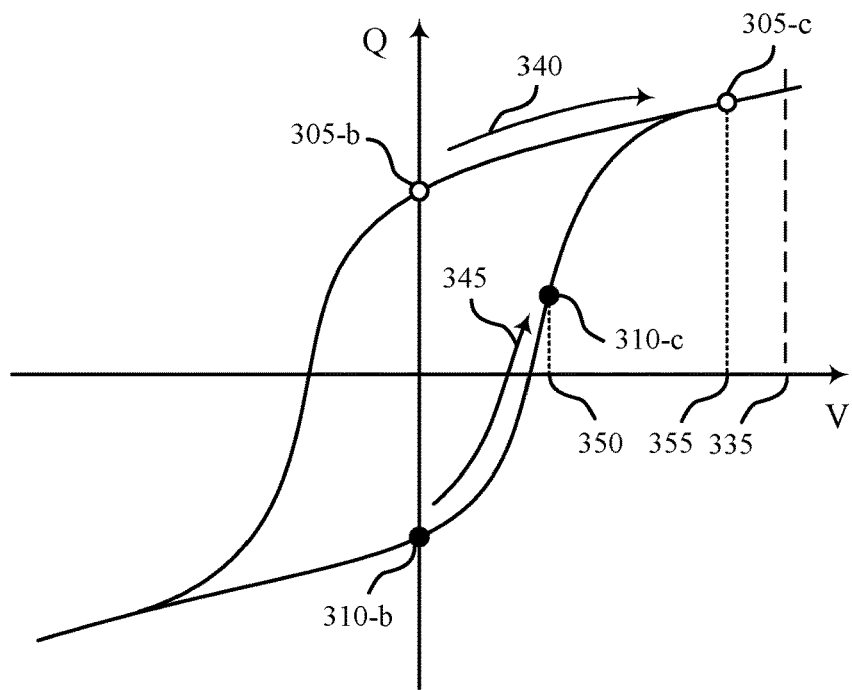

FIGS. 3A and 3B illustrate examples of non-linear electrical properties of a ferroelectric memory cell with hysteresis curves 300-a and 300-b in accordance with various examples as disclosed herein. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 240 described with reference to FIG. 2) as a function of a voltage difference, V.

A ferroelectric material is characterized by a spontaneous electric polarization, that is, it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-a and 300-b represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero-voltage difference, resulting in two possible charged states: a charge state 305 and a charge state 310. According to the examples of FIGS. 3A and 3B, charge state 305 represents a logic 1 and charge state 310 represents a logic 0. In some examples, the logic states of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage.

Charge states 305 and 310 may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor 240 as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on one or more factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. A voltage measured at a sense component may not equal voltage 335, however, and may instead depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

In some sensing schemes, by comparing the digit line voltage to a reference voltage, the initial state of the capacitor may be determined. The digit line voltage may be the difference between voltage 335 and the final voltage across the capacitor, voltage 350 or voltage 355—i.e., the difference between the voltage 335 and the voltage 350 or the difference between the voltage 335 and the voltage 355. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic state of the ferroelectric memory cell (i.e., a logic 0 or 1) may be determined.

In some cases, a ferroelectric memory cell may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction. In some cases, a ferroelectric memory cell may lose its initial logic state after a read operation. For example, if charge state 310-b is stored, the charge state may follow path 345 to charge state 305-c during a read operation and, after removing voltage 335, the charge state may relax to the charge state 305-b by following path 340.

Hysteresis curve 300-b illustrates an example of reading a memory cell that is configured to store the charge state 305-b and the charge state 310-b. A read voltage 335 may be applied, for example, as a voltage difference via a digit line 215 and a plate line 220 as described with reference to FIG. 2. Hysteresis curve 300-b may illustrate read operations where the read voltage 335 is positive voltage difference Vcap (e.g., where VDL-VPL is positive). A positive read voltage across the capacitor may be referred to as a "plate low" read operation, where a digit line 215 is taken initially to a high voltage, and a plate line 220 is initially at a low voltage (e.g., a ground voltage). Although read voltage 335 is shown as a positive voltage across the ferroelectric capacitor 240, in alternative operations a read voltage may be a negative voltage across the ferroelectric capacitor 240, which may be referred to as a "plate high" read operation.

The read voltage 335 may be applied across the ferroelectric capacitor 240 when a memory cell 205 is selected (e.g., by activating a switching component 245 as described with reference to FIG. 2). Upon applying the read voltage 335 to the ferroelectric capacitor 240, charge may flow into or out of the ferroelectric capacitor 240 via the digit line 215 and plate line 220, and different charge states may result depending on whether the ferroelectric capacitor 240 was at charge state 305-b (e.g., a logic 0) or at charge state 310-b (e.g., a logic 1).

Figure 4:
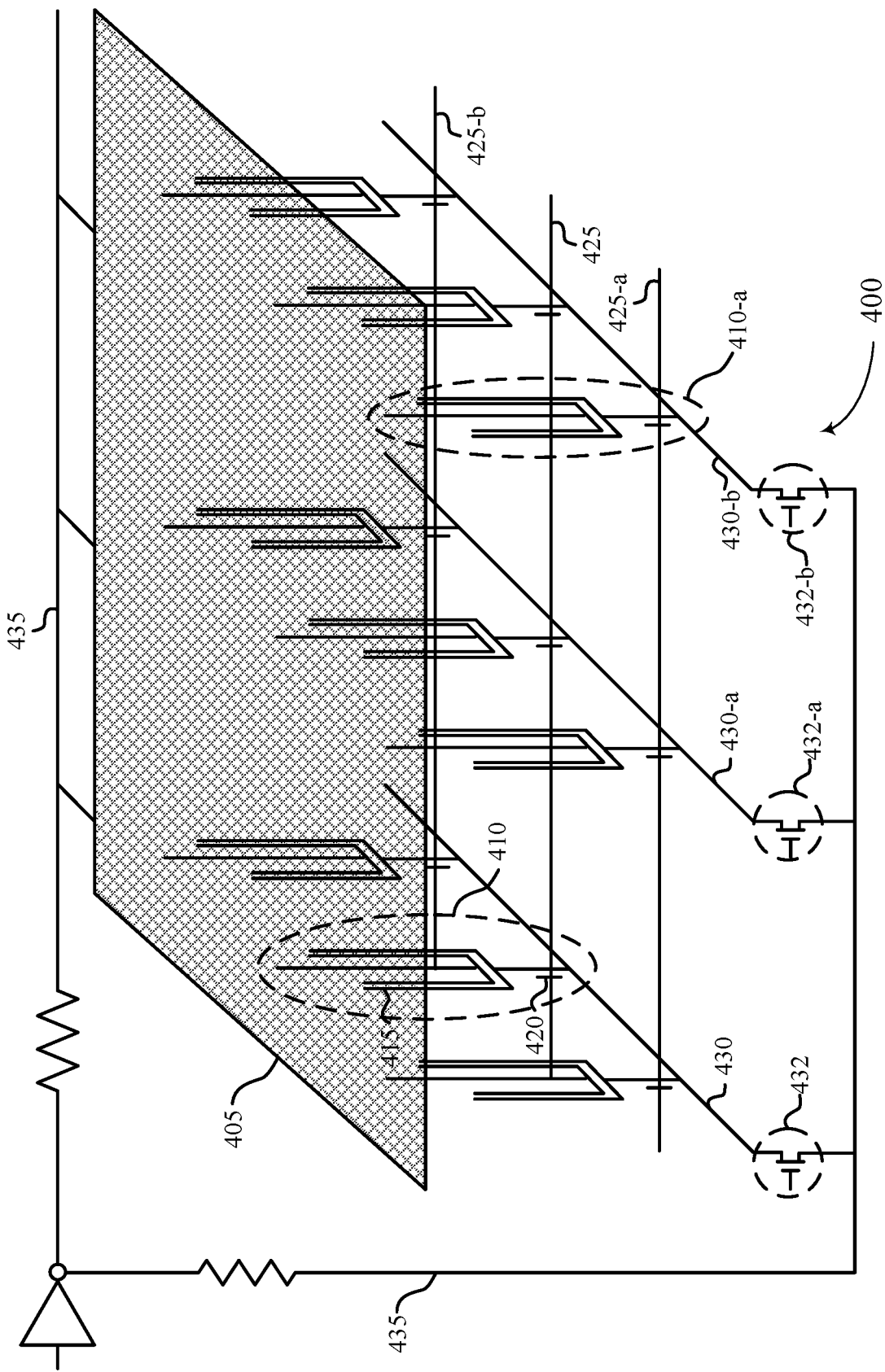
FIG. 4 illustrates an example of a memory array that includes a common plate that supports ferroelectric memory cell access in accordance with examples as disclosed herein.

FIG. 4 illustrates an example of a memory array 400 that includes a common plate and supports ferroelectric memory cell access in accordance with examples as disclosed herein. In some examples, the memory array 400 may be or may represent a portion of a larger memory array. As shown with reference to FIG. 4, the memory array 400 may include a plate 405, a plurality of memory cells (e.g., including memory cell 410 and memory cell 410-a), a plurality of word lines (e.g., including word line 425, word line 425-a, and word line 425-b), a plurality of digit lines (e.g., including digit line 430, digit line 430-a, and digit line 430-b) and a plate line 435.

In some examples, each memory cell may include a transistor or other selector device (e.g., transistor 420 of memory cell 410) and a capacitor (e.g., capacitor 415 of memory cell 410). Each digit line (e.g., digit line 430, 430-a, 430-b) may be coupled with the plate line 435 via a respective transistor (e.g., transistor 432, transistor 432-a, transistor 432-b). Each of transistor 432, transistor 432-a, transistor 432-b may be referred to as a shunt and may be configured to couple one or more of the digit lines 430 to the plate 405. In some examples, the transistors 432 may be located within a column decoder 230 of the memory array 400.

As described herein, a memory cell may be located at an intersection of a word line and a digit line. For example, memory cell 410 may be located at the intersection of word line 425 and digit line 430. The memory cell 410 may include a logic storage component, such as capacitor 415, and a transistor 420 (e.g., a switching or selection component). The capacitor 415 may be an example of a ferroelectric capacitor. A first node of the capacitor 415 may be coupled with the transistor 420 and a second node of the capacitor 415 may be coupled with the plate 405. To access the memory cell 410, the plate 405, the digit line 430, and the word line 425 may be selected (e.g., by adjusting the respective voltages of the plate 405, the digit line 430, and the word line 425) at various times. In some examples, the plate 405 may be selected by applying a voltage to the plate 405 via the plate line 435.

In some examples, the plate 405 may be common to a plurality of memory cells. That is, the plate 405 may be common to at least the memory cell 410 and the memory cell 410-a. The plate 405 may be or may represent a single plate that is included in a unit (e.g., a plate group that includes a plurality of plates), and each unit may be included in a patch (e.g., a patch, which may also be referred to as a tile, or other array subsection that includes a plurality of plate groups). In some examples, the plate 405 may be located above each of the plurality of memory cells of the memory array 400. Stated another way, each memory cell of the memory array 400 may be located below the plate 405 (e.g., below the plate 405 that is common to each of the memory cells). In other examples, the plate 405 may be located below each of the plurality of memory cells of the memory array 400, and each memory cell of the memory array 400 may be located above the plate 405 (e.g., above the plate 405 that is common to each of the memory cells).

In some examples, one or more memory cells of the memory array 400 may be accessed. In some cases, prior to the access, each of the digit lines 430 may be coupled with the plate 405 via a respective shunt 432. As discussed herein, a memory cell (e.g., memory cell 410) may be accessed by uncoupling the digit line 430 from the plate 405, then selecting (e.g., precharging) the digit line 430, and selecting the word line 425. In some examples, a logic state stored by the memory cell 410 may then be sensed (latched), and a voltage of the plate 405 may remain low until after the logic state stored by the memory cell 410 is sensed. Due to the plate remaining low while the digit line 430 and the word line 425 are selected, a first logic state (e.g., a logic "1") may be stored to (written to) the memory cell 410 based on (e.g., as a result of, concurrent with) the sensing.

In some examples, after the first logic state is stored to the memory cell 410, the plate 405 may be selected (e.g., its voltage may be increased to that of the selected digit line 430). After selecting the plate 405, the memory cell 410 may be in a no-stress (e.g., a low-stress) state. For example, selecting the plate 405 may result in the plate 405 and the digit line 430 having a same or similar voltage. Accordingly, a zero-voltage differential may exist across the memory cell 410, thus reducing any stress on the memory cell 410. Additionally or alternatively, after selecting the plate 405, the unselected transistors coupled with the digit line 430 (e.g., memory cells coupled with the digit line 430 and different word lines 425-a, 425-b) may be in a no-stress (e.g., a low-stress, low or zero voltage differential) state. This may minimize leakage from the unselected memory cells (e.g., through the corresponding transistors 420).

Throughout the access operation, unselected digit lines 430-a and 430-b may be coupled (e.g., shunted) with the plate 405. In some examples, the unselected digit lines 430-a and 430-b may be coupled with the plate 405 by activating transistor 432-a and transistor 432-b, respectively, which may result in a voltage of the digit lines tracking a voltage of the plate 405 (e.g., possibly with some lag due to resistive-capacitive (RC) effects).

Additionally or alternatively, the selected digit line 430 may be coupled with the plate 405 one or more times during the access operation by activating the transistor 432. For example, the selected digit line 430 may be decoupled from the plate 405 before being selected and then coupled with the plate 405 after the plate is selected. In some cases (e.g., when a target logic state for the memory cell 410 is different than the logic state written to the memory cell as a byproduct of the sensing operation), the selected digit line may be again decoupled from the plate and then recoupled with the plate after the target logic state is written to the memory cell 410.

After shunting the selected digit line 430 to the plate 405, a target logic state (e.g., a logic state to be stored by the memory cell 410 after the access operation) may be identified or determined (e.g., based on a refresh command or write command) and stored to a latch coupled with the memory array 400. For example, user data (e.g., data to be written to the memory array 400) may be stored to the latch coupled with the memory array 400. By storing data to the latch, the data may be written to the memory cell during certain (e.g., only a subset of) circumstances. For example, a first logic state may have been stored to the memory cell 410 by selecting the digit line 430 and the word line 425 before selecting the plate 405. Accordingly, if the target logic state is the first logic state, a subsequent write operation may need not occur (i.e., because the first logic state is already stored to the memory cell 410). In some examples, the target logic state may be a second logic state (e.g., a logic "0"). In the case of the second logic state being determined for writing to the memory cell 410, the second logic state may be written to the latch, the selected digit line 430 may be decoupled from the plate 405 (e.g., via the transistor 432), and the second logic state may be written to the memory cell 410 using the latch (e.g., based on a signal generated by the latch). As discussed herein, such an approach for accessing a memory cell may reduce stress on the memory cell by placing the memory cell in a low-stress (e.g., a no-stress) state during the access operation, among other benefits. For example, such an approach may support the use of a latch using low voltage components, and having a supply voltage lower than the voltages to which one or more of the digit line or plate line are increased during the access operation.

Figure 5:
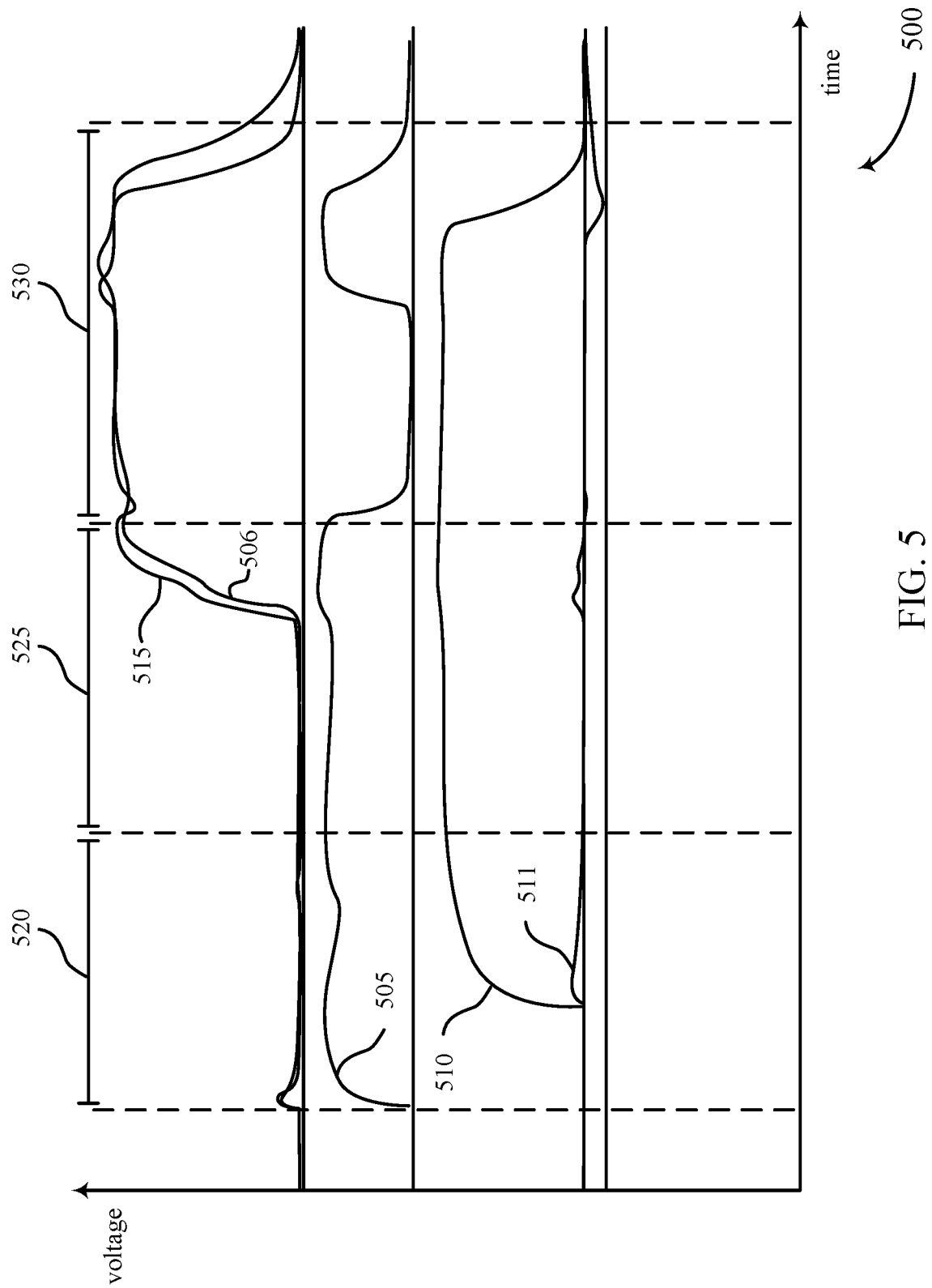
FIG. 5 illustrates an example of a timing diagram that supports ferroelectric memory cell access in accordance with examples as disclosed herein.

FIG. 5 illustrates an example of a timing diagram 500 that supports ferroelectric memory cell access in accordance with examples as disclosed herein. In some examples, the timing diagram 500 may illustrate a first phase 520 (e.g., an "active" stage), a second phase 525 (e.g., a "fire to precharge" stage), and a third phase (e.g., a "precharge" stage). The timing diagram 500 may illustrate voltages of a selected digit line 505, an unselected digit line 506, a selected word line 510, an unselected word line 511, and a plate 515 during the various phases. In some examples, a voltage of the selected digit line 505 may illustrate a voltage of the digit line 430 as described with reference to FIG. 4; a voltage of the unselected digit line 506 may illustrate a voltage of one or more of the unselected digit lines 430-a and 430-b as described with reference to FIG. 4; a voltage of the selected word line 510 may illustrate a voltage of the word line 425 as described with reference to FIG. 4; a voltage of the unselected word line 511 may illustrate a voltage of one or more of the unselected word lines 425-a and 425-b as described with reference to FIG. 4; and a voltage of the plate 515 may illustrate a voltage of the plate 405 (and plate line 435) as described with reference to FIG. 4.

In some examples, the timing diagram may illustrate various phases (portions, parts) of an access operation for a ferroelectric memory cell. In some examples, the access operation and thus the first phase 520 may be based (e.g., in response to) an activate command or other command to open a page (e.g., row) of memory cells. In some cases, the access operation and thus the first phase 520 may also be based (e.g., in response to) a read command or other command including one or more column (e.g., digit line) addresses for access or otherwise indicating a column mask (e.g., one or more digit lines as selected, along with in some cases one or more other digit lines as unselected).

During the first phase 520, a digit line 505 of a memory array (e.g., memory array 400 as described with reference to FIG. 4) may be selected. The selected digit line 505 may correspond to one or more memory cells of the memory array to be accessed. In some examples, the digit line 505 may be selected by applying a voltage (e.g., vbias) to the digit line. Applying the voltage to the digit line 505 may result in the digit line 505 being biased to a first voltage (e.g., to vbias). The first voltage may be configured so as not to disturb the logic state stored by the memory cell when the digit line is subsequently coupled with the ferroelectric capacitor within the memory cell. In some examples, prior to the digit line 505 being increased to the first voltage, the digit line 505 may be decoupled (e.g., unshunted) from the plate 515. While the voltage of the digit line 505 is increased, the remaining (unselected) digit lines 506 of the memory array and the plate 515 may remain low (e.g., unselected). In some examples, digit lines 506 and the plate 515 may remain unselected for the duration of the first phase 520.

After the digit line 505 reaches or begins increasing to the first voltage (e.g., to vbias), a word line 510 coupled with a memory cell common to the digit line 505 may be selected by applying a voltage to the word line 510. In some examples, the voltage applied to the word line 510 may be different than (e.g., lesser than) the first voltage applied to the digit line 505 but may be sufficient to activate (turn on) a transistor (or other selection component) for the memory cell. While the voltage of the word line 510 is increased, the word lines 511 for unselected memory cells may remain unselected (e.g., low). In some examples, the unselected word lines 511 may remain unselected (e.g., at a low voltage) for the duration of the first phase 520.

In some examples, a latch coupled with the digit line 505 may be activated (e.g., fired) some time after the voltage of the word line 510 begins increasing and the digit line 505 becomes coupled with a ferroelectric capacitor within the memory cell. The latch may be activated while the voltage of the word line 510 is increasing or, in some examples, after the word line 510 has reached a target voltage. Activating the latch, which may in some cases be referred to as firing the latch, may result in a logic state of the memory cell being stored to the latch (e.g., sensed).

During the first phase 520, the voltage of the digit line 505 may be high and the voltage of the plate 515 may be low. Accordingly, by the end of the first phase 520, the voltages of the digit line 505 and the plate 515 may result in a first logic state (e.g., a logic "1") being at least partially written to the memory cell.

In some examples, during the second phase 525, a voltage of the digit line 505 may remain high and a voltage of the plate 515 may remain low for a duration (e.g., for a subset of the second phase 525). As discussed above, such voltages may result in a first logic state being at least partially written to the memory cell during the first phase 520. Accordingly, maintaining such voltages of the digit line 505 and the plate 515 during the subset of the second phase 525 may result in the first logic state being written (e.g., fully written) to the memory cell.

During a second duration (e.g., during a second subset of the second phase 525), a voltage of the plate 515 may be increased to a same voltage as the digit line 505 (e.g., to vbias). As discussed above with reference to FIG. 4, the unselected digit lines 506 may be shunted to the plate and, accordingly, a voltage of the unselected digit lines 506 may track the voltage of the plate 515 (i.e., a voltage of the unselected digit lines 506 may increase to vbias). In some cases, the voltage of the unselected digit lines 506 may track the voltage of the plate 515 with some lag (e.g., due to RC effects), as shown in FIG. 5.

In some examples, the selected digit line 505 may be coupled (e.g., recoupled) with the plate 515 after the plate reaches the target voltage (e.g., vbias). In some examples, coupling the selected digit line 505 to the plate may reduce stress on the associated memory cell by ensuring a zero voltage differential across the memory cell. Additionally or alternatively, because the voltage of the unselected digit lines 506 may be equal to the voltage of the plate 515 and the voltage of the selected digit line 505, the voltage across neighboring memory cells may be equal to zero, which may reduce disturbance or leakage associated with the neighboring memory cells (e.g., to the memory cells coupled with the unselected digit lines 506). Thus by coupling the selected digit line 505 to the plate 515 after the plate voltage increases may prevent, mitigate, or otherwise compensate for (e.g., reverse) overshoot that may otherwise occur due to the voltage of the plate 515 increasing and capacitive cross-coupling between the selected digit line 505 and the plate 515 or the unselected digit lines 506 (whose voltages track the plate while coupled therewith). In some examples, rather than coupling the selected digit line 505 with the plate 515 after the plate reaches the target voltage, the selected digit line 505 may be coupled with a voltage source biased at the target voltage (e.g., vbias). For example, the selected digit line 505 may be coupled with the voltage source by activating a transistor configured to couple the selected digit line 505 with the voltage source.

During a subsequent duration (e.g., during a third subset of the second phase 525), the memory device may wait for a period of time (e.g., 2 µs) and monitor for an access command (e.g., a write command) from a user (e.g., a host device) or a precharge command to deactivate the selected word line. In some examples, if a write command is received, data from the user, such as a target logic state for the selected memory cell, may be written to the latch (rather than directly to the memory cell). During the third subset of the second phase 525, the voltage across the selected and unselected memory cells may be held at zero (e.g., due to the shunting the digit line 505 to the plate 515), which may have the effect of reducing stress and leakage. The period between the beginning of the first phase 520 (e.g., receiving an activation command) and the beginning of the third phase 530 (e.g., receiving the precharge command) may in some cases be referred to as a row active time (tRAS). Thus, in some cases, the plate 515 may be selected (its voltage changed (increased)) during the tRAS.

In some examples, during a third phase 530, a logic state stored to the latch (e.g., based on a write command or a refresh or other write-back operation) may be written to the memory cell. In the event of a refresh or write-back operation (e.g., refresh command), the logic state sensed and stored to the latch during the first phase 520 may—if necessary—be written to the memory cell during the third phase 530. In the event of a write command being received from a user, a logic state specified by the write command may be written to the latch, and then—if necessary—to the memory cell during the third phase 530.

The logic state to be written to the memory cell during the third phase 530 may be referred to as the target logic state. In one scenario, the target logic state may be the first logic state (e.g., a logic "1"). Because the first logic state was written to the memory cell earlier in the access operation as a result of the digit line 505 being high while the plate 515 was low, the target logic state being the first logic state may result in no data being written to the memory cell from the latch (e.g., because the memory cell already stores the desired logic state). Alternatively, if the target logic state is a second logic state (e.g., a logic "0"), the latched second logic state may be written to the memory cell. For example, FIG. 5 illustrates an example in which the target logic state is the second logic state, and thus the voltage of the digit line 505 is decreased (e.g., to ground) while the voltage of the plate 515 is held high (e.g., at vbias) for some duration, before the voltage of the digit line 505 is increased (e.g., returned to vbias). In some cases, in order to decrease the voltage of the digit line, the digit line 505 may be decoupled from the plate 515.

After the target logic state is stored by the memory cell, the digit line 505 may be coupled (e.g., re-coupled) with the plate, so that the voltage across the memory cell is zero volts (0V). Subsequently, the word line 510 may be deselected and a voltage of the plate 515 may then be decreased. The voltage of the digit line 505 and unselected digit lines 506 may track the voltage of the plate 515 as it decreases (e.g., due to being coupled with the plate 515). In some examples, once the voltage of the plate 515 is decreased, the memory device may wait for a subsequent access operation to be initiated.

Figure 6:
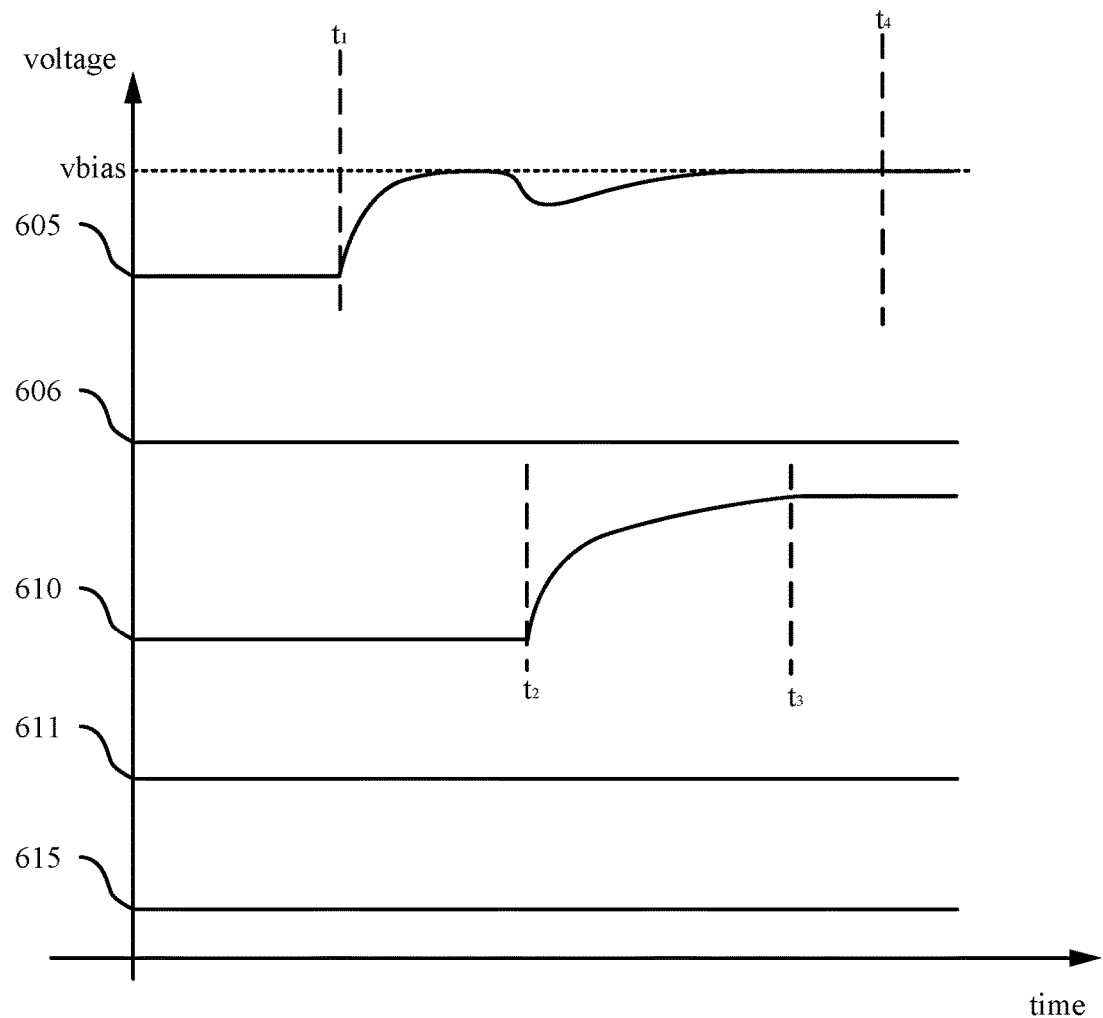
FIG. 6 illustrates an example of a timing diagram that supports ferroelectric memory cell access in accordance with examples as disclosed herein.

FIG. 6 illustrates an example of a timing diagram 600 that supports ferroelectric memory cell access in accordance with examples as disclosed herein. For example, the timing diagram 600 may illustrate a first phase of an access operation, such as the first phase 520 of an access operation as described with reference to FIG. 5. As discussed herein, the first phase 520 may be referred to as an "active" phase. In some examples, the timing diagram 600 may illustrate voltages of a selected digit line 605, one or more unselected digit lines 606, a selected word line 610, one or more unselected word lines 611, and a plate 615 during the first phase. The plate 615 may be common to multiple memory cells coupled with the selected digit line 605 as well as multiple memory cells coupled with the unselected digit lines 606.

In some examples, prior to the first phase, the selected digit line 605 and the unselected digit line 606 may be coupled with the plate 615, such that a voltage of the selected digit line 605 and a voltage of the unselected digit line 606 are a same voltage as a voltage of the plate 615 (e.g., ground). In some examples, the access operation and thus the first phase may be based on (e.g., in response to) an activate command or other command to open a page (e.g., row) of memory cells. In some cases, the access operation and thus the first phase may also be based (e.g., in response to) a read command or other command indicating one or more column (e.g., digit line) addresses for access or otherwise indicating a column mask (e.g., one or more digit lines as selected, along with in some cases one or more other digit lines as unselected). Upon receiving an activate command, the selected digit line 605 may be decoupled from the plate 615.

The first phase may include precharging the selected digit line 605 by applying a voltage to the selected digit line 605 at $t_1$. In some examples, the selected digit line 605 may be precharged before the selected digit line 605 is coupled with a ferroelectric capacitor within a memory cell. The voltage applied to the selected digit line 605 may charge a parasitic capacitance of the selected digit line 605 so that a charge stored in the memory cell is not disturbed when the selected digit line 605 is coupled with the memory cell.

Once the voltage of the selected digit line 605 is equal to the first voltage (e.g., vbias), the word line 610 may be selected. In some examples, the word line 610 may be selected at $t_2$. When the selected word line 610 is activated, a voltage of the selected digit line 605 may temporarily decrease as a result of charge sharing between the selected digit line 605 and the ferroelectric capacitor within a memory cell. In some examples, however, the voltage of the selected digit line 605 may increase back to the first voltage (e.g., to vbias), and thus the charge sharing between the selected digit line 605 and the ferroelectric capacitor within the memory cell may have minimal or no net impact on the determination of the logic state stored by the memory cell prior to $t_1$.

In some examples, selecting the word line 610 may include applying a voltage to the word line 610 such that a selection component for the memory cell becomes conductive at some time after $t_2$. In some examples, the voltage applied to the word line 610 may result in the selection component becoming conductive at or around $t_3$. In some examples, the selection component may comprise transistor (e.g., a thin-film transistor (TFT)) coupled with the selected word line 610, and the selected digit line 605 may become coupled with the ferroelectric capacitor within the memory cell when the selection component becomes conductive.

In some examples, at some time before $t_4$ (e.g., between $t_3$ and $t_4$) the selected digit line 605 may be coupled with a sense amplifier, which may be coupled with a latch. During the first phase, a logic state stored in the memory cell may be sensed based on the digit line 605 and the word line 610 being selected. For example, a logic state of the memory cell may be sensed (e.g., stored to the latch) at or near time $t_4$. In some examples, the duration between $t_1$ and $t_4$ may be equal to the number of clock cycles between a host device issuing the activate command and the host device issuing a read/write command (e.g., tRCD). In some examples, the latch may sense the logic state based on an amount of charge shared between the memory cell and a sense amplifier capacitor (e.g., AMPCAP). If the amount of shared charge (e.g., charge provided to the memory ell by the AMPCAP) is at or above a threshold, the memory cell may be determined as having stored a first logic state (e.g., a logic "1"); and if the amount of shared charge is below the threshold, the memory cell may be determined as having stored a second logic state (e.g., a logic "0").

For example, where the memory cell stores the first logic state, only a change in displacement charge may change for the memory cell; and where the memory cell stores the second logic state, a displacement charge as well as a dipole charge may change for the memory cell. The displacement charge may be associated with charge stored based on a voltage differential across the capacitor, and the dipole charge may be associated with a polarization of the ferroelectric material within the ferroelectric capacitor. The displacement charge and the dipole charge may be considered separate charges, or may be considered components of a single charge, but the teachings herein are not dependent on the underlying theory or mechanism.

In some examples, the time $t_4$ may correspond to a firing event of the latch, which may include the latch being connected to a supply. When the latch is connected to a supply voltage, the latch may develop a sensed signal on one side (e.g., a signal sensed from the memory cell) and a reference signal on the other side (e.g., the opposite side). Because the signals may be different, the latch may become unbalanced, which may indicate the logic state of the memory cell (e.g., a logic "1" or a logic "0"). During the first phase, the unselected digit lines 606, the unselected word lines 611, and the plate 615 may remain unselected (e.g., at a relatively low voltage). Because a voltage of the selected digit line is relatively high and a voltage of the plate is relatively low during this phase, a first logic state (e.g., logic "1") may be at least partially written to the memory cell during the first phase.

As illustrated in FIG. 6, the time $t_4$ occurs later than the time $t_3$. In some examples, however, $t_4$ may occur between time $t_2$ and $t_3$ (e.g., after the word line 610 is selected). Additionally or alternatively, both tRCD (e.g., the duration between $t_1$ and $t_4$) and the duration between the time $t_1$ and the time $t_2$ may be adjustable (e.g., trimmable, such as based on a fuseload procedure). In some examples, after the sensed logic state is stored in the latch, the digit line and the supply voltage may be removed (decoupled) from the latch.

Figure 7:
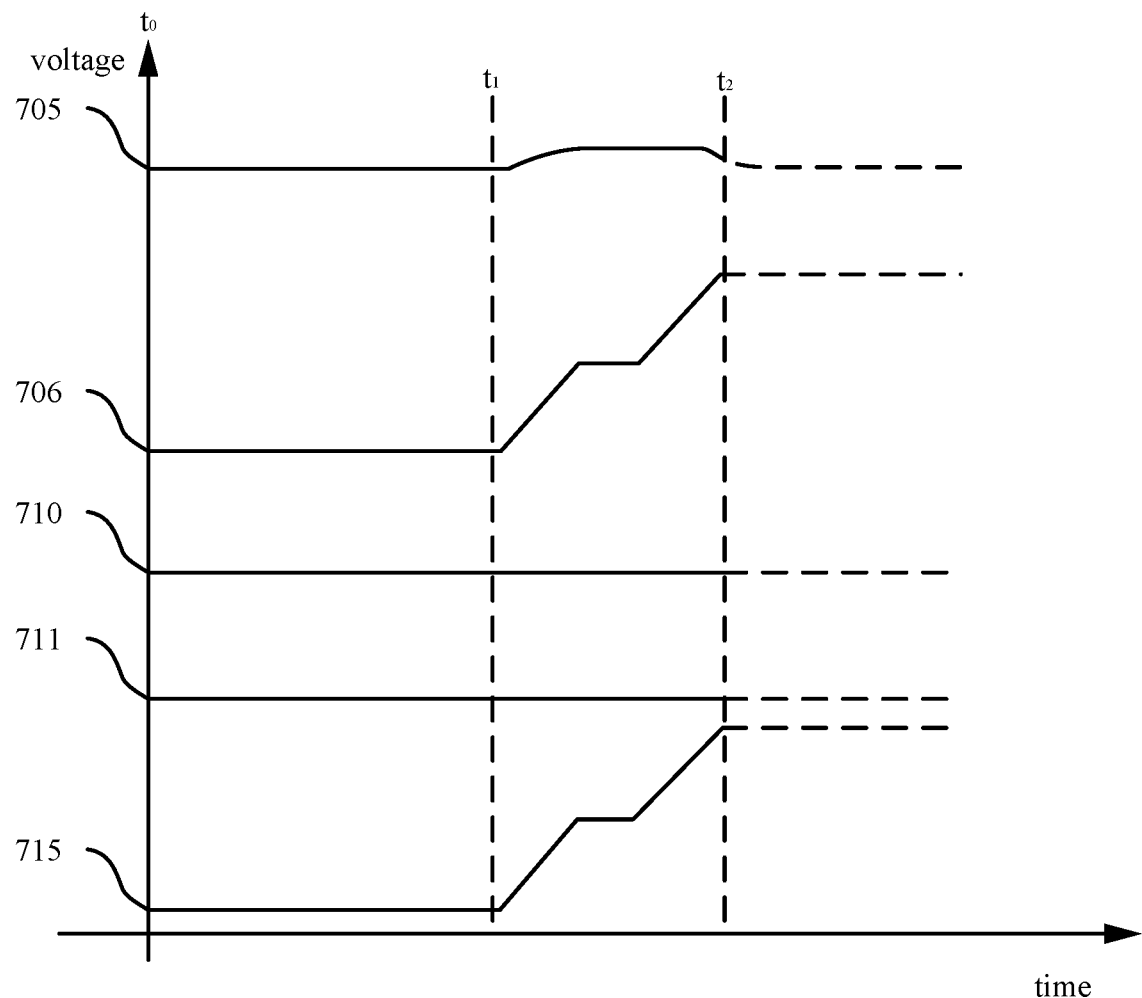
FIG. 7 illustrates an example of a timing diagram that supports ferroelectric memory cell access in accordance with examples as disclosed herein.

FIG. 7 illustrates an example of a timing diagram 700 that supports ferroelectric memory cell access in accordance with examples as disclosed herein. For example, the timing diagram 700 may illustrate a second phase of an access operation, such as the second phase 525 of an access operation as described with reference to FIG. 5. As discussed herein, the second phase 525 may be referred to as a "fire to precharge" phase. In some examples, the timing diagram 700 may illustrate voltages of a selected digit line 705, one or more unselected digit lines 706, a selected word line 710, one or more unselected word lines 711, and a plate 715 during the second phase.

In some examples, the second phase may include multiple sub-phases. For example, a first sub-phase may exist between times $t_0$ and $t_1$, a second sub-phase may exist between times $t_1$ and $t_2$, and a third sub-phase may exist after time $t_2$ (but before a third phase as discussed with reference to FIG. 8).

The first sub-phase, between times $t_0$ and $t_1$, may occur after the firing of the latch as described with reference to FIG. 6. As discussed above, a first logic state (e.g., a logic "1") may be at least partially written to the memory cell during the first phase described with reference to FIG. 6 due to the respective voltages of the digit line 705 and the plate 715. In some cases, during the first sub-phase, between times $t_0$ and $t_1$, the voltage of the digit line 705 and the plate 715 may be maintained in order to finish writing the first logic state to the memory cell. In some examples, the duration between times $t_0$ and $t_1$ may be trimmable. That is, the duration of the first-subphase may be configurable (adjustable). In some cases, the first-subphase may be omitted.

During the second sub-phase beginning at time $t_1$, a voltage of the plate 715 may be increased to a same voltage as that of the digit line 705 at to (e.g., vbias). In some cases, as shown in FIG. 7, the voltage of the plate 715 may be increased in more than one increment (two distinct steps). For example, the voltage of the plate may be increased to an intermediate voltage that is less than vbias, then maintained at the intermediate voltage for some time, then increased from the intermediate voltage to vbias. Such an incremented approach may reduce disturb or other defects (e.g., by reducing a slew rate associated with increasing the voltage of the plate 715 during the second sub-phase). In some cases, to increase the voltage of the plate 715 in multiple steps, the plate 715 may be coupled with multiple voltage supplies or references in sequence (e.g., coupled with a first voltage supply or reference at the intermediate voltage, then coupled with a second voltage supply or reference at the intermediate voltage at vbias). In some cases, to increase the voltage of the plate 715 in multiple steps, the plate 715 may be coupled with a single voltage supply or reference having an adjustable voltage.

In some examples, the unselected digit lines 706 may be coupled (e.g., shunted) with the plate 715 (e.g., throughout the access operation). Accordingly, a voltage of the unselected digit lines 706 may increase as the voltage of the plate 715 increases. Thus, in some examples, the voltage of the unselected digit lines 706 may increase like the voltage of the plate—e.g., in two steps based on the application of two supply voltages—to the first voltage (e.g., to vbias). At the end of the second sub-phase (e.g., at $t_3$) the voltage of the selected digit line 705, the unselected digit lines 706, and the plate 715 may be at or near a same voltage (e.g., vbias). As discussed herein, this may result in reduced stress on the selected memory cell, as well as reduced disturbance to the neighboring memory cells.

In some cases, after the voltage of the plate 715 reaches the target voltage (e.g., vbias) at $t_2$, the selected digit line 705 may be coupled with the plate (e.g., using the corresponding shunt 432). Coupling (e.g., shunting) the selected digit line 705 to the plate 715 after the plate voltage increases may prevent, mitigate, or otherwise compensate for (e.g., reverse) overshoot that may otherwise occur due to the plate voltage increasing and capacitive cross-coupling between the selected digit line 705 and the plate 715 or the unselected digit lines 706. As shown in FIG. 7, between $t_1$ and $t_2$, a minimal overshoot of the selected digit line 705 may occur prior to coupling the selected digit line 705 to the plate 715.

In some examples, rather than couple the selected digit line 705 with the plate 715 after the plate 715 voltage has been increased, the memory device may couple the selected digit line 705 with a voltage source biased at a same voltage as the plate 715 (e.g., vbias). For example, the memory device may couple the selected digit line 705 with the same voltage source used to precharge the digit line as described with reference to FIG. 6. In some examples, the memory device may include a dedicated path, which may include a transistor or other switching device configured to selectively couple the selected digit line 705 with the voltage source. In some cases, the transistor may be a resistive MOS transistor (e.g., a transistor biased in a linear operating range), which may help the control slew rate with which the voltage of the selected digit line 705 may change.

During the third sub-phase (e.g., after $t_3$), the memory device may, for a period of time (e.g., 2 µs), monitor for one or more commands from a user (e.g., from a host device). As discussed herein, the commands may include an access command (such as a write command or a refresh command) or a precharge command, or both. In some cases, a time between $t_1$ in FIG. 6 and the end of the third subphase may be a tRAS for the access procedure.

If a write command is received, data from the user may be written to the latch and—if necessary—to the memory cell. If a refresh command is received, data previously stored to the latch (e.g., during the first phase) may—if necessary—be written to the memory cell.

A precharge command may, in some examples, be configured to deactivate the word line 710. During the third sub-phase, the voltage of the selected digit line 705, unselected digit lines 706, and plate 715 may be held at a same voltage, which may reduce stress on the selected memory cell and leakage or other disturb of the unselected memory cells.

Figure 8:
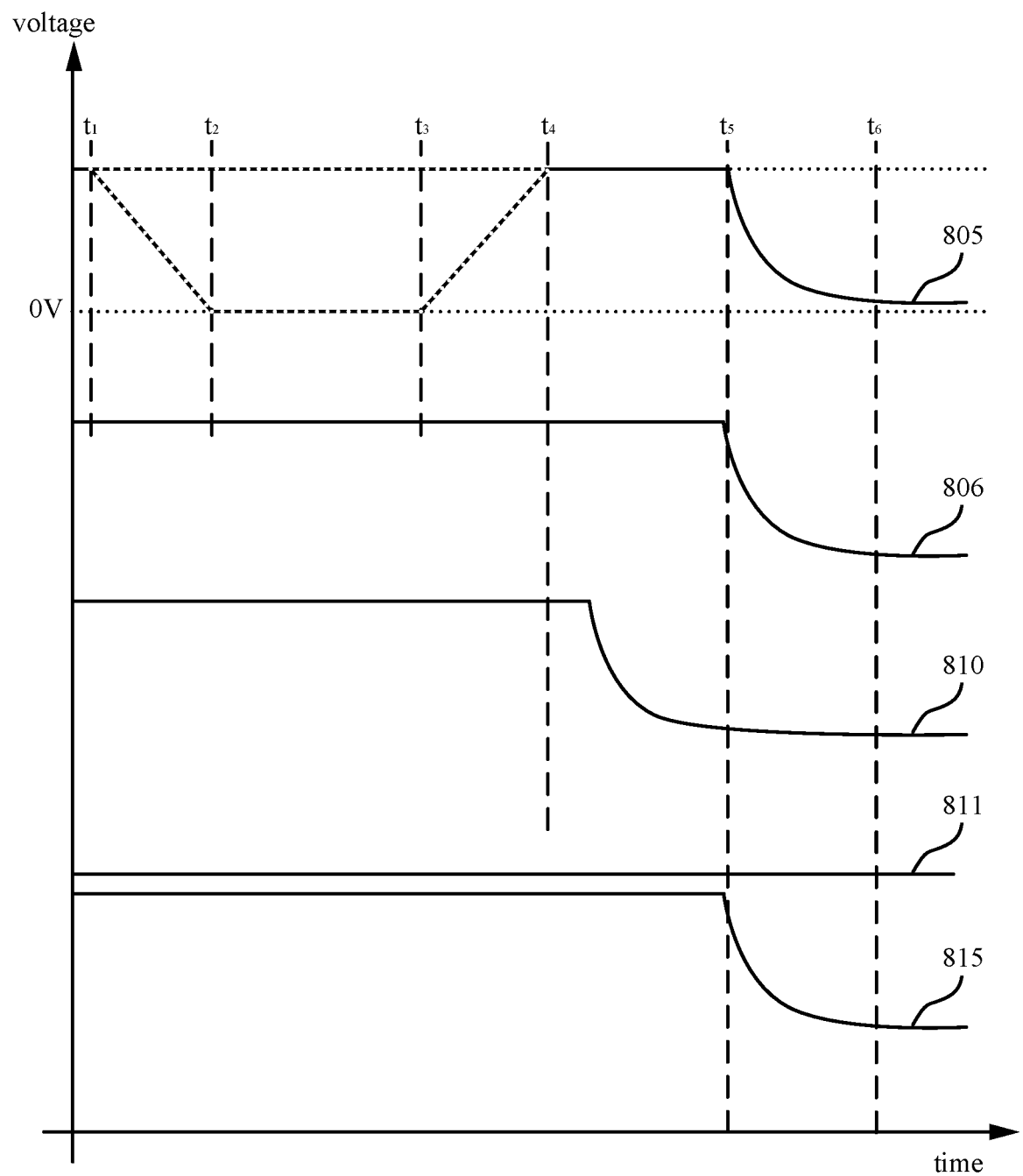
FIG. 8 illustrates an example of a timing diagram that supports ferroelectric memory cell access in accordance with examples as disclosed herein.

FIG. 8 illustrates an example of a timing diagram 800 that supports ferroelectric memory cell access in accordance with examples as disclosed herein. For example, the timing diagram 800 may illustrate a third phase of an access operation, such as the third phase 530 of an access operation as described with reference to FIG. 5. In some examples, the timing diagram 800 may illustrate voltages of a selected digit line 805, one or more unselected digit lines 806, a selected word line 810, one or more unselected word lines 811, and a plate 815 during the third phase. As discussed herein, the third phase 530 may be referred to as a "precharge" phase, and may include deactivating the selected word line 810 and otherwise closing a page of memory cells that may be been opened during the first phase 520. In some cases, the third phase 530 may also include writing a target logic state to the memory cell.

As discussed with reference to FIG. 7, the memory device may wait for a period of time (e.g., 2 μs) prior to the third phase to receive a command from a user (e.g., from a host device). The command may be a write command that specifies the target logic state, or a refresh command. A precharge command may subsequently be received to deactivate the selected word line.

Because a first logic state (e.g., a logic "1") was previously written to the memory cell as a result of the digit line 805 and plate 815 voltages during the first portion of the access operation, no further action may be required to write the target logic state if it is the same as the first logic state. Thus, for example, if a command to write the first logic state to the memory cell is received before the precharge command, or if the sensed logic state in a refresh or write-back scenario was the first logic state, the first logic state may have already been written to the memory cell. Thus, when the target logic state is the first logic state, zero volts may be applied across the memory cell (e.g., a zero voltage differential may exist between the digit line 805 and the plate 815) after the voltage of the plate 815 is increased (e.g., after $t_3$ in FIG. 7), which may reduce stress on the selected memory cell and the risk of disturb or leakage for other (unselected) memory cells. In some examples, in the case of the target logic state being the same as the first logic state, the digit line 805 may remain coupled (e.g., shunted) with the plate until $t_5$.

Alternatively, in some examples, the digit line 805 may be decoupled from the plate at $t_1$. For example, the digit line 805 may be decoupled from the plate at $t_1$ whether the target logic state is the first logic state (e.g., a logic "1") or a different logic state. Decoupling the digit line 805 from the plate, may result in a voltage of the digit line 805 being electrically floating, but the voltage of the digit line 805 may not change (e.g., leakage from the memory cell may not occur), because the plate 815 and unselected digit lines 806 may be at a same voltage as the selected digit line 805. If the target logic state is the first logic state the voltage of the digit line 805 may remain floating, in some examples, until $t_4$. Decoupling the digit line 805 from the plate 815, regardless of the target logic state, may simplify one or more aspects of a control scheme and related signaling (e.g., phases) associated with the access operation, and may support writing the target logic state to the memory cell in case the target logic state is different than the first logic state.

Additionally or alternatively, in some examples, in the case of the target logic state being the first logic state, the digit line 805 may be actively biased back to the first voltage (e.g., to vbias). In some such cases, biasing the digit line 805 to the first voltage may include coupling the digit line 805 with the latch, in which case the latch may have a voltage supply or reference with a voltage at least as high the first voltage (e.g., greater than or equal to vbias), and/or the latch may include one or more high-voltage-tolerant transistors, with relatively thicker gate oxide layers or other physical dimensions, and/or a level shifting circuit may be coupled with the latch and the digit line 805.

In some cases, floating the digit line 805 or coupling the digit line 805 with the plate 815 between $t_1$ and $t_4$—and only writing the target logic state to the memory cell during that time if the target logic state differs from the first logic state—may support the use of voltage supply for the latch that with a voltage lower than the first voltage (e.g., less than vbias), and/or the latch may include low-voltage transistors (e.g., with relatively faster switching speeds).

In some examples, when the target logic state is a second logic state (e.g., a logic "0"), the digit line 805 may be decoupled from the plate 815 at $t_1$ and the voltage of the digit line 805 may subsequently be reduced to a second voltage (e.g., ground). For example, the digit line 805 may be coupled with a voltage source at the second voltage or a ground reference. The voltage of the digit line 805 may decrease to the second voltage (e.g., at or near zero volts) by $t_2$. In some examples, the selected digit line 805 may be coupled with the voltage source or ground via a transistor driven by the logic state stored in the latch, as described with reference to FIG. 9. Between the times $t_2$ and $t_3$, the voltage of the selected digit line 805 may be held at the reduced second voltage (e.g., ground). The voltage of the plate 815 may remain relatively high (e.g., at vbias) between the times $t_2$ and $t_3$ (e.g., between the times $t_1$ and $t_4$ or $t_5$) and the voltage difference between the voltage of the plate 815 and the voltage of the selected digit line voltage 805 may be applied across the memory cell. This may result in the second logic state being written to the memory cell.

In some examples, between times $t_3$ and $t_4$, a voltage of the selected digit line 805 may be increased by applying a voltage to the selected digit line 805. In some examples, the voltage of the selected digit line 805 may be increased to the first voltage (e.g., to vbias). In some examples, the voltage of the selected digit line may be increased using the dedicated path (e.g., transistor) as described with reference to FIG. 7. Additionally or alternatively, the voltage of the selected digit line 805 may be increased using a precharge circuit previously used to precharge the selected digit line 805 during the first phase (e.g., as described with reference to FIG. 6). In some examples, the precharge circuit may provide less voltage or slew rate control than the dedicated path.

After the voltage of the selected digit line 805 reaches the first voltage, the selected digit line 805 may be coupled (e.g., shunted) to the plate 815 (e.g., at $t_4$). In some examples, this may result in a zero voltage across the memory cell. Between $t_4$ and $t_5$, the selected word line 810 may then be deactivated, followed by the plate 815 being deactivated. Because the selected digit line 805 and the unselected digit lines may be coupled with the plate 815, the voltage of the selected digit line 805 and voltage of the unselected digit line 806 may decrease with the voltage of the plate 815. In some examples, the voltage of the plate 815 may be decreased relatively quickly, due to the shunt between the selected digit line 805 and the plate 815 ensuring that a zero voltage across the memory cell is maintained. For example, the voltage of the plate 815 may decrease more quickly (e.g., with a greater slew rate) between $t_5$ and $t_6$ than the voltage of the plate 815 may increase between $t_1$ and $t_2$ of FIG. 7. In some examples, the third phase may end at or around $t_6$, when all voltages are low.

Figure 9:
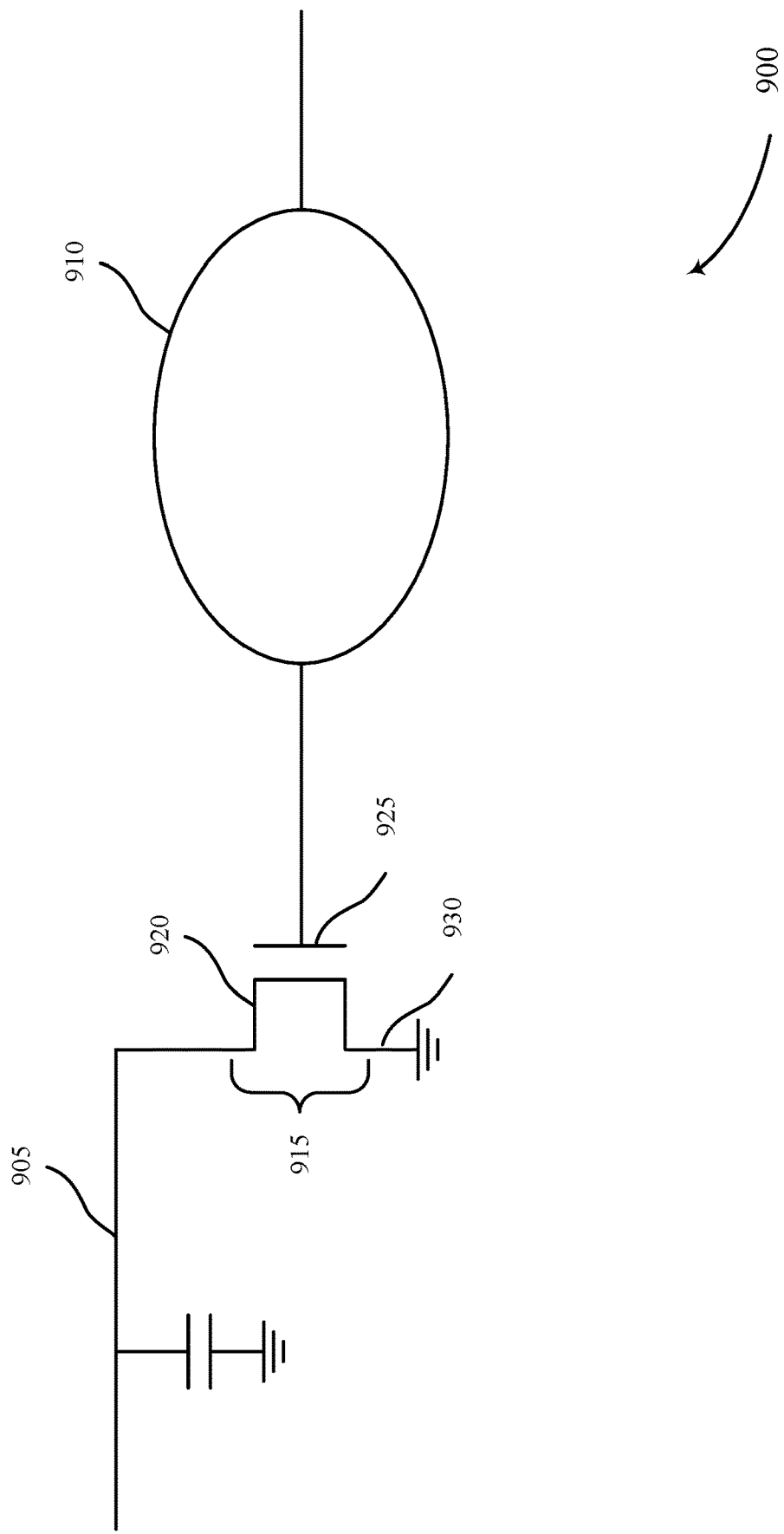
FIG. 9 illustrates an example of a circuit that supports ferroelectric memory cell access in accordance with examples as disclosed herein.

FIG. 9 illustrates an example circuit 900 that supports ferroelectric memory cell access in accordance with examples as disclosed herein. In some examples, the circuit may include a digit line 905, which may be an example of a selected digit line as described herein, and a latch 910. In some examples, the digit line 905 may be coupled with the latch 910 via a transistor 915. In some examples, the transistor 915 may be an n-type MOS (NMOS), and may include a drain 920, a gate 925, and a source 930, where the source 930 is coupled with a zero voltage source (e.g., ground). The digit line 905 may be connected to the drain 920, and the latch 910 may be connected to the gate 925.

As described herein, a memory device may receive a command to write a second logic state (e.g., a logic "0") to a memory cell, or may determine that the second logic state is to be written to the memory cell based on a refresh command or other write-back scenario. The second logic state may be stored in the latch 910 (e.g., may be written to the latch based on a write command from a host device, or may be stored in the latch 910 based on a prior sensing operation, such as in accordance with first phase 520).

When the latch 910 stores the second logic state, the latch may generate a signal, which may be applied to the gate 925, that may be a sufficiently high voltage to activate the transistor 915. Accordingly, when the latch 910 stores the second logic state, the voltage applied to the gate 925 may result in a current flowing between the source 930 and the drain 920, thus coupling the digit line 905 to the zero voltage source. A voltage of the digit line 905 may thus decrease to a ground voltage, as described with reference to FIG. 8. In some examples, the transistor 915 may be a resistive MOS (e.g., a MOS configured to be biased in a linear operating range when activated by the latch 910), which may cause the digit line 905 voltage to decrease relatively slowly). Thus the digit line 905 may not decrease to zero volts with a high slew rate, which may risk unintended disturbance.

Figure 10:
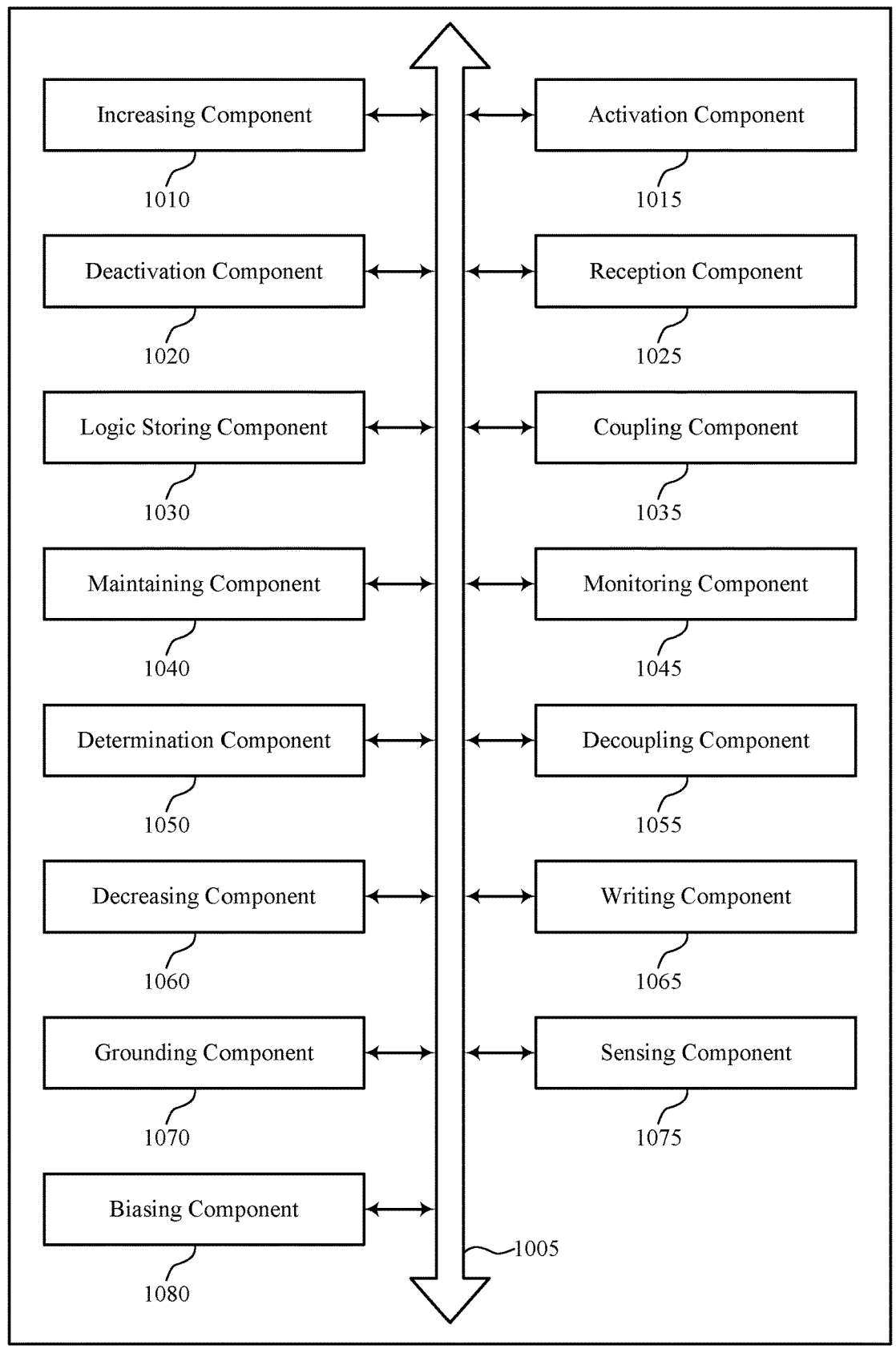
FIG. 10 shows a block diagram of a memory access manager that supports ferroelectric memory cell access in accordance with aspects of the present disclosure.

FIG. 10 shows a block diagram 1000 of a memory access manager 1005 that supports ferroelectric memory cell access in accordance with examples as disclosed herein. The memory access manager 1005 may be an example of aspects of a memory device as described with reference to FIGS. 4 through 9. The memory access manager 1005 may include an increasing component 1010, an activation component 1015, a deactivation component 1020, a reception component 1025, a logic storing component 1030, a coupling component 1035, a maintaining component 1040, a monitoring component 1045, a determination component 1050, a decoupling component 1055, a decreasing component 1060, a writing component 1065, a grounding component 1070, a sensing component 1075, and a biasing component 1080. Each of these modules may communicate, directly or indirectly, with one another (e.g., via one or more buses).

The increasing component 1010 may increase, as part of an access procedure for a ferroelectric memory cell, a voltage of a digit line coupled with the ferroelectric memory cell from a first voltage to a second voltage. In some examples, the increasing component 1010 may increase, after activating the word line, a voltage of a plate coupled with the ferroelectric memory cell from the first voltage to the second voltage. In some examples, the increasing component 1010 may increase a voltage of a digit line for a ferroelectric memory cell to a bias voltage. In some examples, the increasing component 1010 may increase, after the voltage of the digit line reaches the bias voltage, a voltage of a word line for the ferroelectric memory cell to an activation voltage.

In some examples, the increasing component 1010 may increase, after sensing the first logic state, a voltage of a plate for the ferroelectric memory cell to the bias voltage. In some examples, the increasing component 1010 may increase the voltage of the plate from the first voltage to an intermediate voltage. In some examples, the increasing component 1010 may increase the voltage of the plate from the intermediate voltage to the second voltage after the duration. In some examples, the increasing component 1010 may increase the voltage of the digit line from the first voltage to the second voltage after decreasing the voltage of the digit line from the second voltage to the first voltage.

The activation component 1015 may activate, based on increasing the voltage of the digit line, a word line coupled with the ferroelectric memory cell to couple the digit line with a ferroelectric capacitor included in the ferroelectric memory cell. In some examples, the activation component 1015 may activate, before increasing the voltage of the plate from the first voltage to the second voltage, a latch configured to sense a logic state stored by the ferroelectric memory cell.

The deactivation component 1020 may deactivate the word line, after increasing the voltage of the plate, to decouple the ferroelectric capacitor from the digit line.

The reception component 1025 may receive a precharge command for the ferroelectric memory cell after the plate reaches the second voltage, where deactivating the word line is based on receiving the precharge command. In some examples, the reception component 1025 may receive an activate command for the ferroelectric memory cell, where activating the word line is based on receiving the activate command, and where increasing the voltage of the plate from the first voltage to the second voltage occurs during a row active time (tRAS) for the activate and precharge commands. In some examples, the reception component 1025 may receive, after the plate reaches the second voltage, a write command indicating a target logic state for the ferroelectric memory cell, the target logic state including one of a first logic state or a second logic state.

The logic storing component 1030 may store a first logic state or a second logic state to the ferroelectric memory cell.

The coupling component 1035 may couple the digit line with the plate during the access procedure. In some examples, the coupling component 1035 may couple the digit line with the plate occurs after the voltage of the plate reaches the second voltage. In some examples, the coupling component 1035 may couple the digit line to the plate after writing the second logic state to the ferroelectric memory cell.

The maintaining component 1040 may maintain the plate at the intermediate voltage for a duration. In some examples, the maintaining component 1040 may maintain, for a duration, the plate at the first voltage before increasing the voltage of the plate from the first voltage to the second voltage. In some examples, the maintaining component 1040 may maintain, for a second duration, the digit line and the plate at the second voltage. In some examples, the maintaining component 1040 may maintain, based on the target logic state being the first logic state, the digit line and the plate at the second voltage at least until deactivating the word line. In some examples, the maintaining component 1040 may maintain, when the target logic state is the first logic state, the digit line and the plate at the second voltage at least until deactivating the word line.

The monitoring component 1045 may monitor for a write command or a precharge command for the ferroelectric memory cell during the second duration.

The determination component 1050 may determine, after the plate reaches the bias voltage, a second logic state for the ferroelectric memory cell. In some examples, the determination component 1050 may determine that a target logic state for the ferroelectric memory cell is the first logic state. In some examples, the determination component 1050 may determine that a target logic state for the ferroelectric memory cell is the second logic state.

The decoupling component 1055 may decouple the digit line from the plate. In some examples, the decoupling component 1055 may decouple the digit line from the plate.

The decreasing component 1060 may decrease, after biasing the digit line to the write voltage, the voltage of the word line. In some examples, the decreasing component 1060 may decrease, after decreasing the voltage of the word line, the voltage of the plate and the voltage of the digit line. In some examples, the decreasing component 1060 may decrease, based on the target logic state being the second logic state, the voltage of the digit line from the second voltage to the first voltage. In some examples, the decreasing component 1060 may decrease the voltage of the plate and the voltage of the digit line from the second voltage to the first voltage after deactivating the word line.

The writing component 1065 may write the second logic state to the ferroelectric memory cell based on decreasing the voltage of the digit line to the second voltage. In some examples, the writing component 1065 may write the target logic state to a latch. In some examples, the writing component 1065 may write, when the target logic state is the second logic state, the target logic state to the ferroelectric memory cell based on a drive signal generated by the latch.

The grounding component 1070 may ground the digit line.

The sensing component 1075 may sense, after the voltage of the word line reaches the activation voltage, a first logic state for the ferroelectric memory cell.

The biasing component 1080 may bias the digit line to a write voltage for the second logic state.

Figure 11:
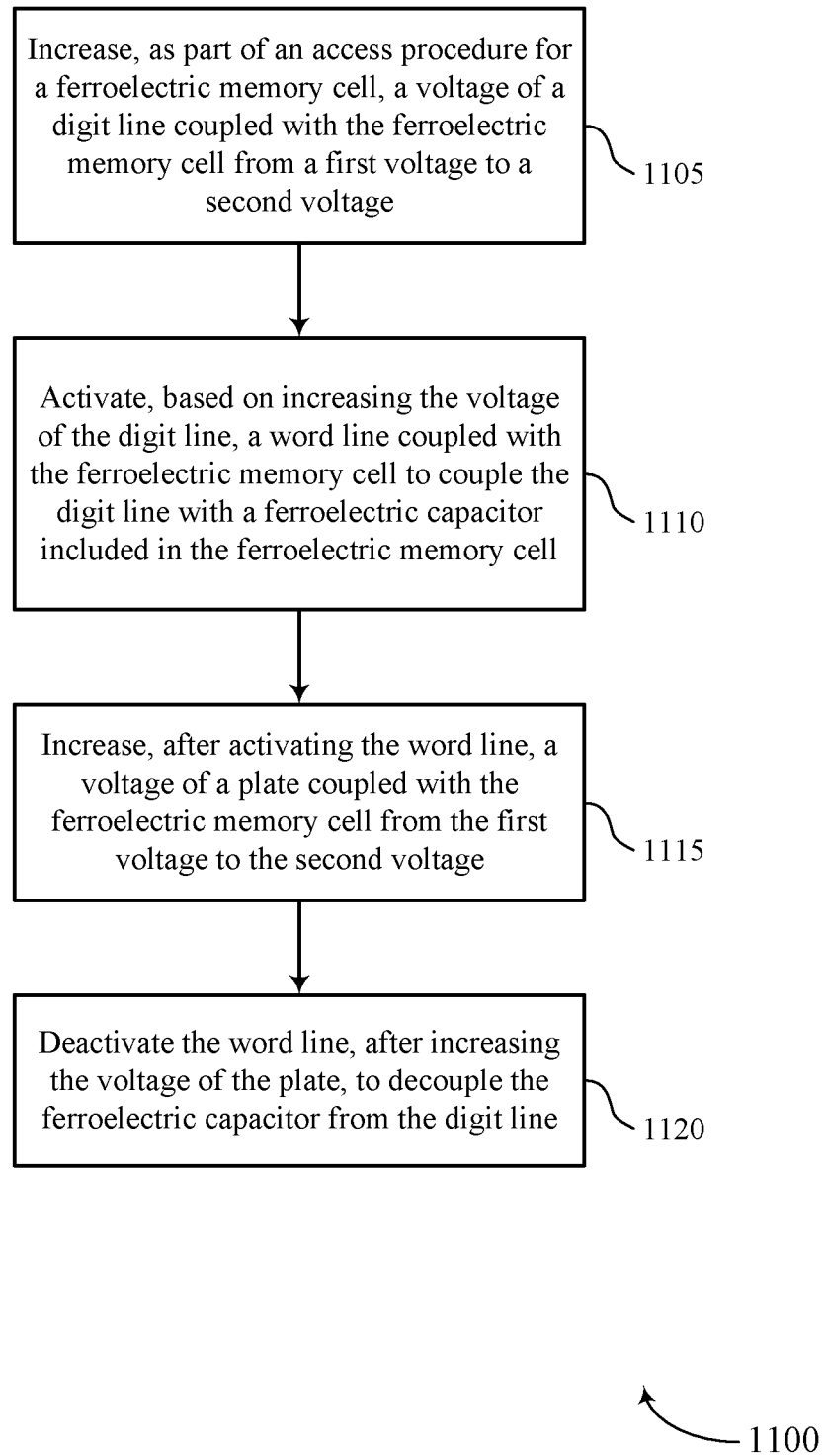
FIGS. 11 through 14 show flowcharts illustrating a method or methods that support ferroelectric memory cell access in accordance with examples as disclosed herein.

FIG. 11 shows a flowchart illustrating a method or methods 1100 that supports ferroelectric memory cell access in accordance with aspects of the present disclosure. The operations of method 1100 may be implemented by a memory device or its components as described herein. For example, the operations of method 1100 may be performed by a memory access manager as described with reference to FIG. 10. In some examples, a memory device may execute a set of instructions to control the functional elements of the memory device to perform the described functions. Additionally or alternatively, a memory device may perform aspects of the described functions using special-purpose hardware.

At 1105, a voltage of a digit line coupled with the ferroelectric memory cell may be increased, as part of an access procedure for the ferroelectric memory cell, from a first voltage to a second voltage. The operations of 1105 may be performed according to the methods described herein. In some examples, aspects of the operations of 1105 may be performed by an increasing component as described with reference to FIG. 10.

At 1110, a word line coupled with the ferroelectric memory cell may be activated, based on increasing the voltage of the digit line, to couple the digit line with a ferroelectric capacitor included in the ferroelectric memory cell. The operations of 1110 may be performed according to the methods described herein. In some examples, aspects of the operations of 1110 may be performed by an activation component as described with reference to FIG. 10.

At 1115, a voltage of a plate coupled with the ferroelectric memory cell may be increased, after activating the word line, from the first voltage to the second voltage. The operations of 1115 may be performed according to the methods described herein. In some examples, aspects of the operations of 1115 may be performed by an increasing component as described with reference to FIG. 10.

At 1120, the word line may be deactivated, after increasing the voltage of the plate, to decouple the ferroelectric capacitor from the digit line. The operations of 1120 may be performed according to the methods described herein. In some examples, aspects of the operations of 1120 may be performed by a deactivation component as described with reference to FIG. 10.

In some examples, an apparatus as described herein may perform a method or methods, such as the method 1100. The apparatus may include features, means, or instructions (e.g., a non-transitory computer-readable medium storing instructions executable by a processor) for increasing, as part of an access procedure for a ferroelectric memory cell, a voltage of a digit line coupled with the ferroelectric memory cell from a first voltage to a second voltage, activating, based on increasing the voltage of the digit line, a word line coupled with the ferroelectric memory cell to couple the digit line with a ferroelectric capacitor included in the ferroelectric memory cell, increasing, after activating the word line, a voltage of a plate coupled with the ferroelectric memory cell from the first voltage to the second voltage, and deactivating the word line, after increasing the voltage of the plate, to decouple the ferroelectric capacitor from the digit line.

Some examples of the method 1100 and the apparatus described herein may further include operations, features, means, or instructions for receiving a precharge command for the ferroelectric memory cell after the plate reaches the second voltage, where deactivating the word line may be based on receiving the precharge command.

Some examples of the method 1100 and the apparatus described herein may further include operations, features, means, or instructions for receiving an activate command for the ferroelectric memory cell, where activating the word line may be based on receiving the activate command, and where increasing the voltage of the plate from the first voltage to the second voltage occurs during a row active time (tRAS) for the activate and precharge commands.

Some examples of the method 1100 and the apparatus described herein may further include operations, features, means, or instructions for activating, before increasing the voltage of the plate from the first voltage to the second voltage, a latch configured to sense a logic state stored by the ferroelectric memory cell.

In some examples of the method 1100 and the apparatus described herein, the ferroelectric memory cell may be configured to store one of a first logic state or a second logic state, and where the ferroelectric memory cell may be at least partially written to the first logic state before the latch may be activated.

Some examples of the method 1100 and the apparatus described herein may further include operations, features, means, or instructions for coupling the digit line with the plate during the access procedure.

Some examples of the method 1100 and the apparatus described herein may further include operations, features, means, or instructions for coupling the digit line with the plate occurs after the voltage of the plate reaches the second voltage.

In some examples of the method 1100 and the apparatus described herein, increasing the voltage of the plate from the first voltage to the second voltage may include operations, features, means, or instructions for increasing the voltage of the plate from the first voltage to an intermediate voltage, maintaining the plate at the intermediate voltage for a duration, and increasing the voltage of the plate from the intermediate voltage to the second voltage after the duration.

Some examples of the method 1100 and the apparatus described herein may further include operations, features, means, or instructions for maintaining, for a duration, the plate at the first voltage before increasing the voltage of the plate from the first voltage to the second voltage, where.

Some examples of the method 1100 and the apparatus described herein may further include operations, features, means, or instructions for maintaining, for a second duration, the digit line and the plate at the second voltage, and monitoring for a write command or a precharge command for the ferroelectric memory cell during the second duration.

Some examples of the method 1100 and the apparatus described herein may further include operations, features, means, or instructions for determining that a target logic state for the ferroelectric memory cell may be the first logic state, and maintaining, based on the target logic state being the first logic state, the digit line and the plate at the second voltage at least until deactivating the word line.

In some examples of the method 1100 and the apparatus described herein, maintaining the digit line at the second voltage may include operations, features, means, or instructions for decoupling the digit line from the plate.

Some examples of the method 1100 and the apparatus described herein may further include operations, features, means, or instructions for determining that a target logic state for the ferroelectric memory cell may be the second logic state, decreasing, based on the target logic state being the second logic state, the voltage of the digit line from the second voltage to the first voltage, and writing the second logic state to the ferroelectric memory cell based on decreasing the voltage of the digit line to the second voltage.

In some examples of the method 1100 and the apparatus described herein, decreasing the voltage of the digit line from the second voltage to the first voltage may include operations, features, means, or instructions for decoupling the digit line from the plate, and grounding the digit line.

Some examples of the method 1100 and the apparatus described herein may further include operations, features, means, or instructions for increasing the voltage of the digit line from the first voltage to the second voltage after decreasing the voltage of the digit line from the second voltage to the first voltage.

Some examples of the method 1100 and the apparatus described herein may further include operations, features, means, or instructions for coupling the digit line to the plate after writing the second logic state to the ferroelectric memory cell.

Some examples of the method 1100 and the apparatus described herein may further include operations, features, means, or instructions for decreasing the voltage of the plate and the voltage of the digit line from the second voltage to the first voltage after deactivating the word line.

Some examples of the method 1100 and the apparatus described herein may further include operations, features, means, or instructions for receiving, after the plate reaches the second voltage, a write command indicating a target logic state for the ferroelectric memory cell, the target logic state including one of a first logic state or a second logic state, writing the target logic state to a latch, maintaining, when the target logic state may be the first logic state, the digit line and the plate at the second voltage at least until deactivating the word line, and writing, when the target logic state may be the second logic state, the target logic state to the ferroelectric memory cell based on a drive signal generated by the latch.

Figure 12:
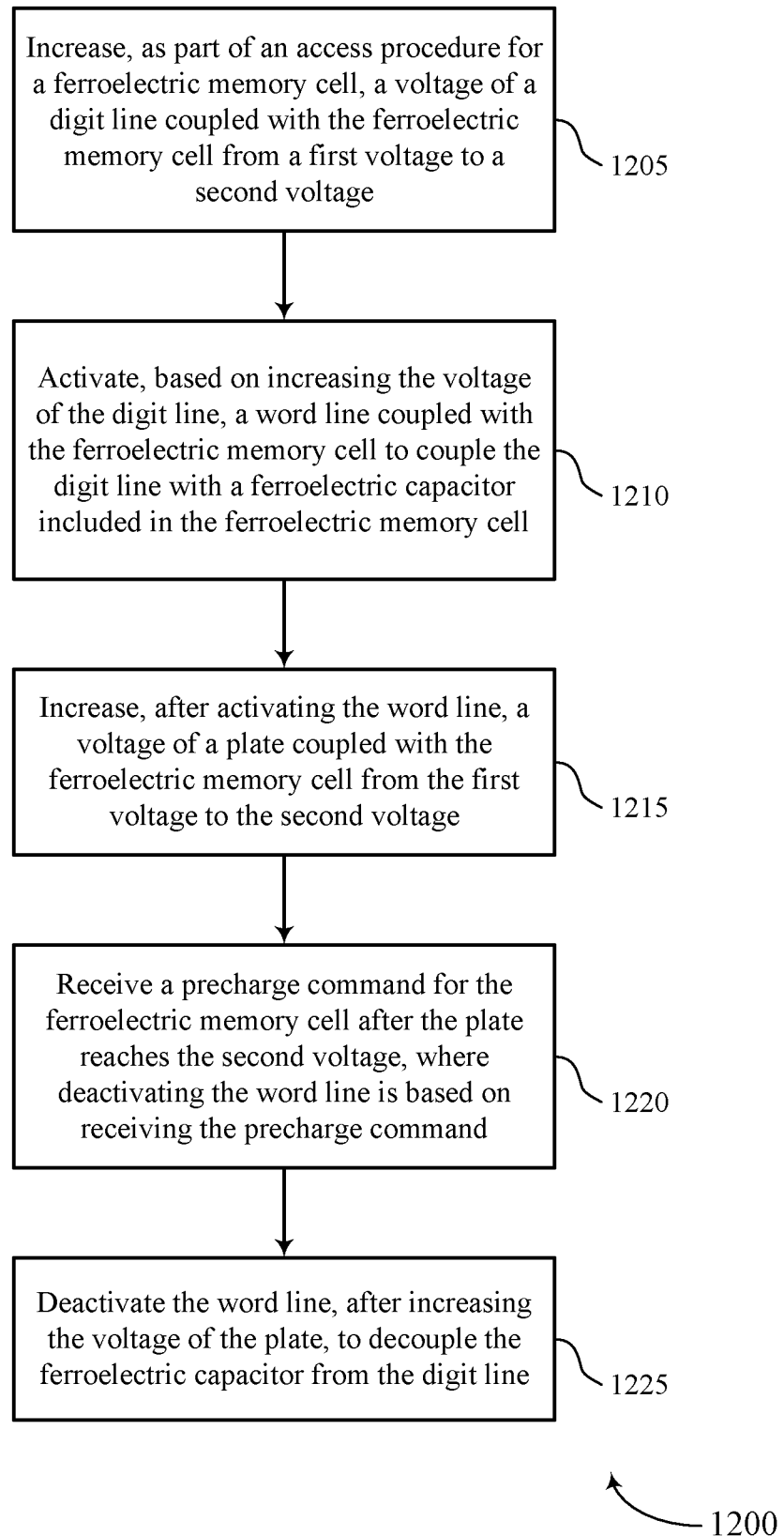

FIG. 12 shows a flowchart illustrating a method or methods 1200 that supports ferroelectric memory cell access in accordance with aspects of the present disclosure. The operations of method 1200 may be implemented by a memory device or its components as described herein. For example, the operations of method 1200 may be performed by a memory access manager as described with reference to FIG. 10. In some examples, a memory device may execute a set of instructions to control the functional elements of the memory device to perform the described functions. Additionally or alternatively, a memory device may perform aspects of the described functions using special-purpose hardware.

At 1205, a voltage of a digit line coupled with the ferroelectric memory cell may be increased, as part of an access procedure for a ferroelectric memory cell, from a first voltage to a second voltage. The operations of 1205 may be performed according to the methods described herein. In some examples, aspects of the operations of 1205 may be performed by an increasing component as described with reference to FIG. 10.

At 1210, a word line coupled with the ferroelectric memory cell may be activated, based on increasing the voltage of the digit line, to couple the digit line with a ferroelectric capacitor included in the ferroelectric memory cell. The operations of 1210 may be performed according to the methods described herein. In some examples, aspects of the operations of 1210 may be performed by an activation component as described with reference to FIG. 10.

At 1215, a voltage of a plate coupled with the ferroelectric memory cell may be increased, after activating the word line, from the first voltage to the second voltage. The operations of 1215 may be performed according to the methods described herein. In some examples, aspects of the operations of 1215 may be performed by an increasing component as described with reference to FIG. 10.

At 1220, a precharge command for the ferroelectric memory cell may be received after the plate reaches the second voltage, where deactivating the word line is based on receiving the precharge command. The operations of 1220 may be performed according to the methods described herein. In some examples, aspects of the operations of 1220 may be performed by a reception component as described with reference to FIG. 10.

At 1225, the word line may be deactivated, after increasing the voltage of the plate, to decouple the ferroelectric capacitor from the digit line. The operations of 1225 may be performed according to the methods described herein. In some examples, aspects of the operations of 1225 may be performed by a deactivation component as described with reference to FIG. 10.

Figure 13:
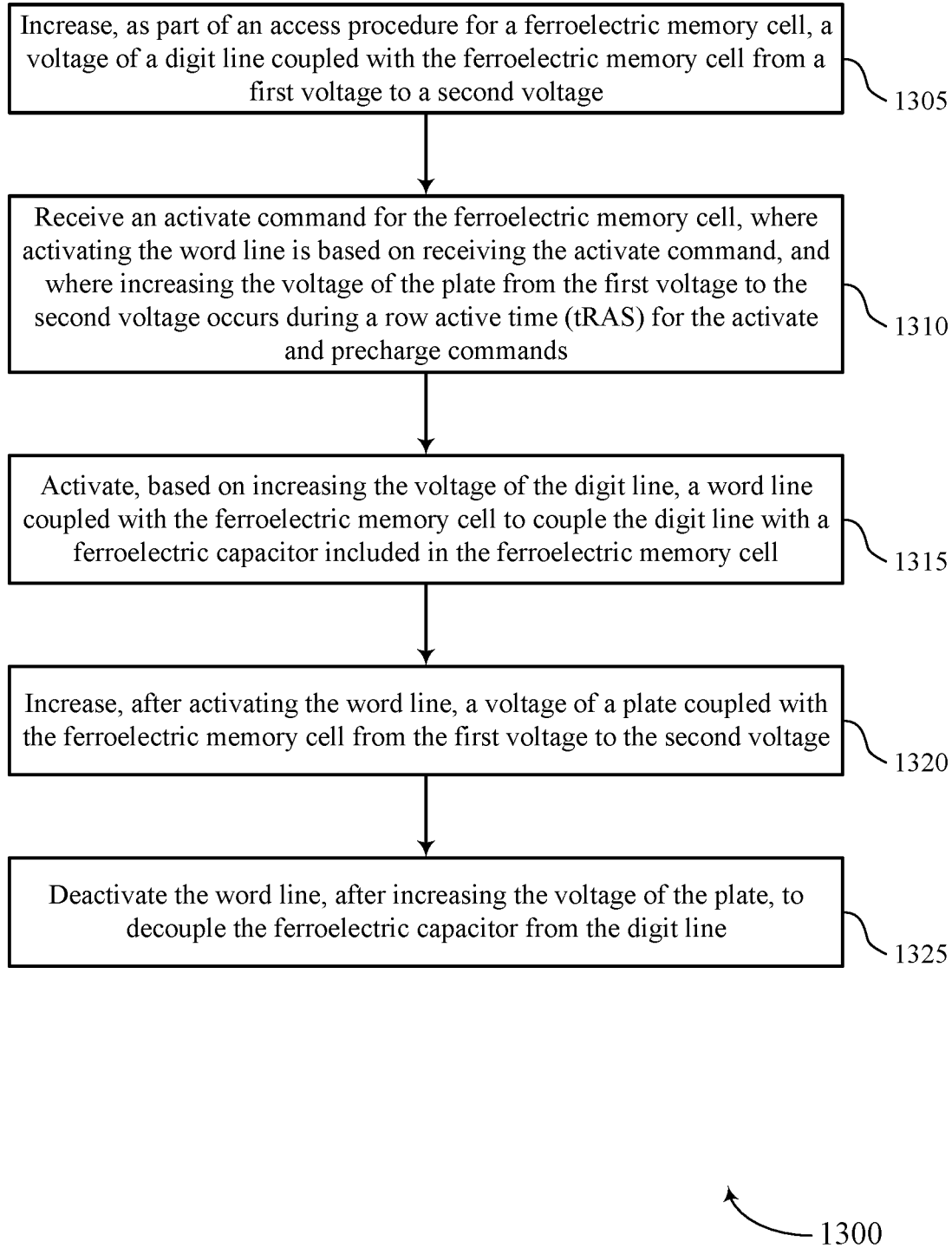

FIG. 13 shows a flowchart illustrating a method or methods 1300 that supports ferroelectric memory cell access in accordance with aspects of the present disclosure. The operations of method 1300 may be implemented by a memory device or its components as described herein. For example, the operations of method 1300 may be performed by a memory access manager as described with reference to FIG. 10. In some examples, a memory device may execute a set of instructions to control the functional elements of the memory device to perform the described functions. Additionally or alternatively, a memory device may perform aspects of the described functions using special-purpose hardware.

At 1305, a voltage of a digit line coupled with the ferroelectric memory cell may be increased, as part of an access procedure for a ferroelectric memory cell, from a first voltage to a second voltage. The operations of 1305 may be performed according to the methods described herein. In some examples, aspects of the operations of 1305 may be performed by an increasing component as described with reference to FIG. 10.

At 1310, an activate command for the ferroelectric memory cell may be received, where activating the word line is based on receiving the activate command, and where increasing the voltage of the plate from the first voltage to the second voltage occurs during a row active time (tRAS) for the activate and precharge commands. The operations of 1310 may be performed according to the methods described herein. In some examples, aspects of the operations of 1310 may be performed by a reception component as described with reference to FIG. 10.

At 1315, a word line coupled with the ferroelectric memory cell may be activated, based on increasing the voltage of the digit line, to couple the digit line with a ferroelectric capacitor included in the ferroelectric memory cell. The operations of 1315 may be performed according to the methods described herein. In some examples, aspects of the operations of 1315 may be performed by an activation component as described with reference to FIG. 10.

At 1320, a voltage of a plate coupled with the ferroelectric memory cell may be increased, after activating the word line, from the first voltage to the second voltage. The operations of 1320 may be performed according to the methods described herein. In some examples, aspects of the operations of 1320 may be performed by an increasing component as described with reference to FIG. 10.

At 1325, the word line may be deactivated, after increasing the voltage of the plate, to decouple the ferroelectric capacitor from the digit line. The operations of 1325 may be performed according to the methods described herein. In some examples, aspects of the operations of 1325 may be performed by a deactivation component as described with reference to FIG. 10.

Figure 14:
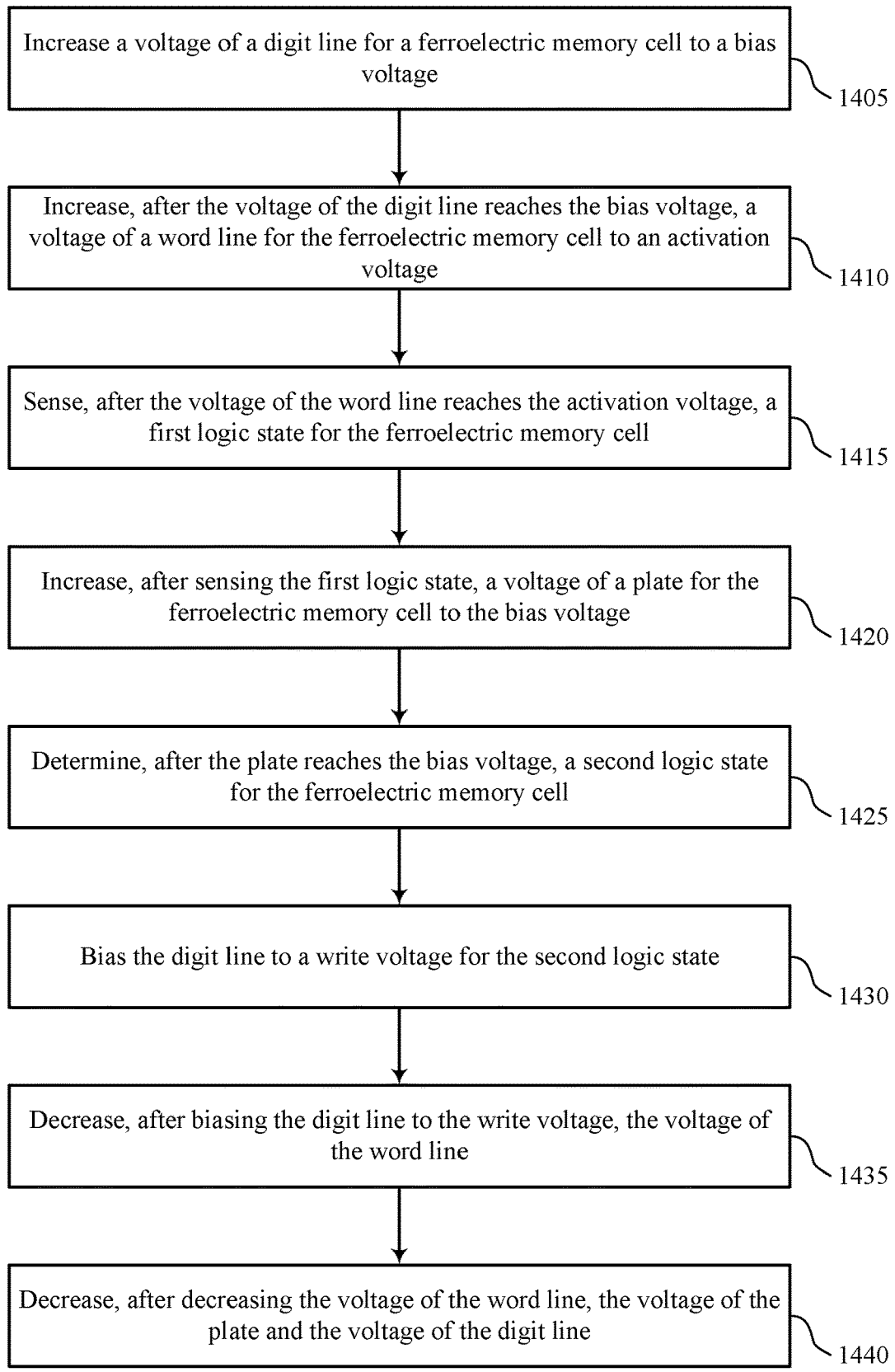

FIG. 14 shows a flowchart illustrating a method or methods 1400 that supports ferroelectric memory cell access in accordance with aspects of the present disclosure. The operations of method 1400 may be implemented by a memory device or its components as described herein. For example, the operations of method 1400 may be performed by a memory access manager as described with reference to FIG. 10. In some examples, a memory device may execute a set of instructions to control the functional elements of the memory device to perform the described functions. Additionally or alternatively, a memory device may perform aspects of the described functions using special-purpose hardware.

At 1405, a voltage of a digit line for a ferroelectric memory cell may be increased to a bias voltage. The operations of 1405 may be performed according to the methods described herein. In some examples, aspects of the operations of 1405 may be performed by an increasing component as described with reference to FIG. 10.

At 1410, a voltage of a word line for the ferroelectric memory cell may be increased, after the voltage of the digit line reaches the bias voltage, to an activation voltage. The operations of 1410 may be performed according to the methods described herein. In some examples, aspects of the operations of 1410 may be performed by an increasing component as described with reference to FIG. 10.

At 1415, a first logic state for the ferroelectric memory cell may be sensed after the voltage of the word line reaches the activation voltage. The operations of 1415 may be performed according to the methods described herein. In some examples, aspects of the operations of 1415 may be performed by a sensing component as described with reference to FIG. 10.

At 1420, a voltage of a plate for the ferroelectric memory cell may be increased, after sensing the first logic state, to the bias voltage. The operations of 1420 may be performed according to the methods described herein. In some examples, aspects of the operations of 1420 may be performed by an increasing component as described with reference to FIG. 10.

At 1425, the memory array may determine a second logic state for the ferroelectric memory cell after the plate reaches the bias voltage. The operations of 1425 may be performed according to the methods described herein. In some examples, aspects of the operations of 1425 may be performed by a determination component as described with reference to FIG. 10.

At 1430, the digit line may be biased to a write voltage for the second logic state. The operations of 1430 may be performed according to the methods described herein. In some examples, aspects of the operations of 1430 may be performed by a biasing component as described with reference to FIG. 10.

At 1435, the voltage of the word line may be decreased after biasing the digit line to the write voltage. The operations of 1435 may be performed according to the methods described herein. In some examples, aspects of the operations of 1435 may be performed by a decreasing component as described with reference to FIG. 10.

At 1440, the voltage of the plate and the voltage of the digit line may be decreased after decreasing the voltage of the word line. The operations of 1440 may be performed according to the methods described herein. In some examples, aspects of the operations of 1440 may be performed by a decreasing component as described with reference to FIG. 10.

In some examples, an apparatus as described herein may perform a method or methods, such as the method 1400. The apparatus may include features, means, or instructions (e.g., a non-transitory computer-readable medium storing instructions executable by a processor) for increasing a voltage of a digit line for a ferroelectric memory cell to a bias voltage, increasing, after the voltage of the digit line reaches the bias voltage, a voltage of a word line for the ferroelectric memory cell to an activation voltage, sensing, after the voltage of the word line reaches the activation voltage, a first logic state for the ferroelectric memory cell, increasing, after sensing the first logic state, a voltage of a plate for the ferroelectric memory cell to the bias voltage, determining, after the plate reaches the bias voltage, a second logic state for the ferroelectric memory cell, biasing the digit line to a write voltage for the second logic state, decreasing, after biasing the digit line to the write voltage, the voltage of the word line, and decreasing, after decreasing the voltage of the word line, the voltage of the plate and the voltage of the digit line.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a ferroelectric memory cell coupled with a digit line and a word line, a plate coupled with the ferroelectric memory cell, a controller coupled with the digit line, the word line, and the plate, where the controller is configured to cause the apparatus to, bias the plate at a first voltage, bias the digit line at a second voltage, and activate the word line during a first portion of an access procedure for the ferroelectric memory cell, read, based on activating the word line, a logic state stored by the ferroelectric memory cell, transition the plate from the first voltage to the second voltage during a second portion of the access procedure, receive a precharge command after the plate reaches the second voltage, and deactivate the word line, based on the precharge command, during a third portion of the access procedure.

In some examples, the ferroelectric memory cell may be configured to be written to a first logic state based on the first portion of the access procedure, the controller may be further configured to cause the apparatus to, maintain, when the second logic state may be the same as the first logic state, the digit line and the plate at the second voltage until the word line may be deactivated, bias, when the second logic state may be different than the first logic state, the digit line at the first voltage then bias the digit line at the second voltage before the word line may be deactivated, and maintain the digit line and the plate at the second voltage for a duration after the word line may be deactivated.

Some examples of the apparatus may include a transistor coupled with the controller and configured to selectively couple the digit line with the plate, where the controller may be further configured to cause the apparatus to.

Some examples of the apparatus may include a column decoder coupled with the digit line, where the column decoder includes the transistor.

Some examples of the apparatus may include a transistor coupled with the digit line, a ground reference, and a node of a latch, where, the ferroelectric memory cell may be configured to store one of a first logic state or a second logic state, the node of the latch may be configured to may have a voltage that may be higher than a threshold voltage of the transistor when the latch stores the second logic state, and the latch may have a supply voltage that may be lower than the second voltage.

Some examples of the apparatus may include a set of additional ferroelectric memory cells coupled with the plate, and a set of additional digit lines coupled with the set of additional ferroelectric memory cells, where the controller may be coupled with the set of additional digit lines and may be further configured to cause the apparatus to.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   selecting, as part of an access operation for a memory cell, a digit line from a set of digit lines;
   coupling the selected digit line with a capacitor of the memory cell;
   coupling a subset of the set of digit lines with a plate, the plate coupled with the memory cell; and
   increasing, after coupling the subset of the set of digit lines with the plate, a voltage of the plate from a first voltage to a second voltage while the selected digit line is coupled with the capacitor.

2. The method of claim 1, further comprising:
   increasing, before coupling the selected digit line with the capacitor, a voltage of the selected digit line from the first voltage to the second voltage.

3. The method of claim 2, wherein coupling the selected digit line with the capacitor comprises:
   activating, based at least in part on increasing the voltage of the selected digit line, a word line coupled with the memory cell.

4. The method of claim 3, further comprising:
   deactivating the word line, after increasing the voltage of the plate, to decouple the capacitor from the selected digit line; and
   decreasing the voltage of the plate and the voltage of the selected digit line to the first voltage after deactivating the word line.

5. The method of claim 1, further comprising:
   coupling the selected digit line with the plate during the access operation.

6. The method of claim 5, wherein coupling the selected digit line with the plate occurs after the voltage of the plate reaches the second voltage.

7. The method of claim 1, further comprising:
   coupling the selected digit line to a voltage source after the plate reaches the second voltage, the voltage source biased at the second voltage.

8. The method of claim 1, further comprising:
   activating, before increasing the voltage of the plate from the first voltage to the second voltage, a latch operable to sense a logic state stored by the memory cell.

9. The method of claim 8, wherein the memory cell is operable to store one of a first logic state or a second logic state, and wherein the memory cell is at least partially written to the first logic state before the latch is activated.

10. The method of claim 1, wherein the subset of the set of digit lines comprises unselected digit lines.

11. A memory system, comprising:
    a set of memory cells;
    a set of digit lines couplable with the set of memory cells;
    a plate coupled with the set of memory cells; and one or more controllers coupled with the set of digit lines and the plate, wherein the one or more controllers are configured to cause the memory system to:
- select, as part of an access operation for a memory cell of the set of memory cells, a digit line from the set of digit lines;
- couple the selected digit line with a capacitor of the memory cell;
- couple a subset of the set of digit lines with the plate; and
- increase, after coupling the subset of the set of digit lines with the plate, a voltage of the plate from a first voltage to a second voltage while the selected digit line is coupled with the capacitor.

12. The memory system of claim 11, wherein the one or more controllers are further operable to cause the memory system to:
- increase, before coupling the selected digit line with the capacitor, a voltage of the selected digit line from the first voltage to the second voltage.

13. The memory system of claim 12, wherein, to couple the selected digit line with the capacitor, the one or more controllers are further operable to cause the memory system to:
- activate, based at least in part on increasing the voltage of the selected digit line, a word line coupled with the memory cell.

14. The memory system of claim 13, wherein the one or more controllers are further operable to cause the memory system to:
- deactivate the word line, after increasing the voltage of the plate, to decouple the capacitor from the selected digit line; and
- decrease the voltage of the plate and the voltage of the selected digit line to the first voltage after deactivating the word line.

15. The memory system of claim 11, wherein the one or more controllers are further operable to cause the memory system to:
- couple the selected digit line with the plate after the plate reaches the second voltage.

16. The memory system of claim 15, wherein coupling the selected digit line with the plate occurs after the voltage of the plate reaches the second voltage.

17. The memory system of claim 11, wherein the one or more controllers are further operable to cause the memory system to:
- couple the selected digit line to a voltage source after the plate reaches the second voltage, the voltage source biased at the second voltage.

18. The memory system of claim 11, wherein the one or more controllers are further operable to cause the memory system to:
- activate, before increasing the voltage of the plate from the first voltage to the second voltage, a latch operable to sense a logic state stored by the memory cell.

19. The memory system of claim 11, wherein the subset of the set of digit lines comprises unselected digit lines.

20. An apparatus, comprising:
- a memory cell;
- a plate line coupled with the memory cell; and
- a set of digit lines, the set of digit lines comprising:
  - a digit line operable to be selected and coupled with a capacitor of the memory cell as part of an access operation for the memory cell; and
  - a subset of digit lines operable to be coupled with the plate line during the access operation, wherein the plate line is configured to have a voltage increased from a first voltage to a second voltage while the selected digit line is coupled with the capacitor.

* * * * *